(12) United States Patent
Yu et al.

(10) Patent No.: US 10,037,892 B2
(45) Date of Patent: Jul. 31, 2018

(54) MULTI-CHIP STRUCTURE AND METHOD OF FORMING SAME

(71) Applicant: Taiwan Semiconductor Manufacturing Company, Ltd., Hsinchu (TW)

(72) Inventors: Chen-Hua Yu, Hsinchu (TW); Der-Chyang Yeh, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/594,756

(22) Filed: May 15, 2017

(65) Prior Publication Data

US 2017/0250090 A1    Aug. 31, 2017

Related U.S. Application Data

(63) Continuation of application No. 15/085,837, filed on Mar. 30, 2016, now Pat. No. 9,653,433, which is a
(Continued)

(51) Int. Cl.
*H01L 21/3105* (2006.01)
*H01L 25/00* (2006.01)
(Continued)

(52) U.S. Cl.
CPC ...... *H01L 21/31053* (2013.01); *H01L 21/565* (2013.01); *H01L 21/568* (2013.01); *H01L 21/6835* (2013.01); *H01L 23/3128* (2013.01); *H01L 23/481* (2013.01); *H01L 23/49838* (2013.01); *H01L 24/05* (2013.01); *H01L 24/14* (2013.01); *H01L 24/17* (2013.01); *H01L 24/19* (2013.01); *H01L 24/81* (2013.01); *H01L 24/92* (2013.01); *H01L 25/0657* (2013.01); *H01L 25/18* (2013.01); *H01L 25/50* (2013.01); *H01L 24/13* (2013.01); *H01L 2221/68381* (2013.01);
(Continued)

(58) Field of Classification Search
CPC .................................................. H01L 21/31053
See application file for complete search history.

(56) References Cited

U.S. PATENT DOCUMENTS 6,514,794 B2    2/2003   Haba et al.
6,753,206 B2    6/2004   Huang et al.
(Continued)

FOREIGN PATENT DOCUMENTS

CN    102117798 A    7/2011
CN    102573279 A    7/2012
(Continued)

*Primary Examiner* — William Coleman
(74) *Attorney, Agent, or Firm* — Slater Matsil, LLP

(57) ABSTRACT

A device includes a redistribution layer over a molding compound layer, a first chip over the fan-out structure, wherein the first chip comprise a plurality of first through vias connected to the redistribution layer and a second chip over the first chip, the second chip being connected to the first chip through a plurality of bumps, wherein the first chip and the second chip are in the molding compound layer, and wherein a center line of the first chip is not vertically aligned with a center line of the second chip.

20 Claims, 20 Drawing Sheets

Related U.S. Application Data continuation of application No. 14/177,947, filed on Feb. 11, 2014, now Pat. No. 9,324,698.

(60) Provisional application No. 61/865,411, filed on Aug. 13, 2013.

(51) Int. Cl.
*H01L 23/00* (2006.01)
*H01L 23/31* (2006.01)
*H01L 21/56* (2006.01)
*H01L 25/065* (2006.01)
*H01L 25/18* (2006.01)
*H01L 21/683* (2006.01)
*H01L 23/48* (2006.01)
*H01L 23/498* (2006.01)

(52) U.S. Cl.
CPC ............... *H01L 2224/02379* (2013.01); *H01L 2224/0345* (2013.01); *H01L 2224/0401* (2013.01); *H01L 2224/04105* (2013.01); *H01L 2224/05008* (2013.01); *H01L 2224/0572* (2013.01); *H01L 2224/05569* (2013.01); *H01L 2224/05572* (2013.01); *H01L 2224/12105* (2013.01); *H01L 2224/131* (2013.01); *H01L 2224/13022* (2013.01); *H01L 2224/16146* (2013.01); *H01L 2224/16235* (2013.01); *H01L 2224/1703* (2013.01); *H01L 2224/17181* (2013.01); *H01L 2224/73204* (2013.01); *H01L 2224/73259* (2013.01); *H01L 2224/81005* (2013.01); *H01L 2224/81815* (2013.01); *H01L 2224/9202* (2013.01); *H01L 2224/92224* (2013.01); *H01L 2225/06513* (2013.01); *H01L 2225/06517* (2013.01); *H01L 2225/06527* (2013.01); *H01L 2225/06541* (2013.01); *H01L 2225/06562* (2013.01); *H01L 2225/06568* (2013.01); *H01L 2924/12042* (2013.01); *H01L 2924/15311* (2013.01); *H01L 2924/181* (2013.01); *H01L 2924/18161* (2013.01)

(56) References Cited

U.S. PATENT DOCUMENTS

| | | |
|---|---|---|
| 7,550,857 B1 | 6/2009 | Longo et al. |
| 7,582,953 B2 | 9/2009 | Lin |
| 8,110,910 B2 | 2/2012 | Kim |
| 8,252,629 B2 | 8/2012 | Yee et al. |
| 8,253,232 B2 | 8/2012 | Kim et al. |
| 8,890,329 B2 | 11/2014 | Kim et al. |
| 9,324,698 B2 | 4/2016 | Yu et al. |
| 2006/0267188 A1 | 11/2006 | Ishino et al. |
| 2007/0023887 A1 | 2/2007 | Matsui |
| 2010/0258933 A1 | 10/2010 | Fujishima et al. |
| 2011/0298119 A1 | 12/2011 | Cho et al. |
| 2012/0119346 A1 | 5/2012 | Im et al. |
| 2012/0146209 A1 | 6/2012 | Hu et al. |
| 2013/0011967 A1 | 1/2013 | Ishino et al. |
| 2013/0037802 A1 | 2/2013 | England et al. |
| 2013/0056866 A1 | 3/2013 | Samoilov et al. |
| 2013/0105973 A1 | 5/2013 | Gan et al. |
| 2014/0225246 A1* | 8/2014 | Henderson ............ H01L 21/50 257/691 |
| 2014/0252632 A1 | 9/2014 | Barth et al. |
| 2014/0264831 A1 | 9/2014 | Meyer |
| 2014/0264836 A1 | 9/2014 | Chun et al. |

FOREIGN PATENT DOCUMENTS

| | | |
|---|---|---|
| CN | 102983112 A | 3/2013 |
| JP | 2006319243 A | 11/2006 |
| KR | 101140113 B1 | 4/2012 |
| TW | 201123319 A | 7/2011 |

\* cited by examiner

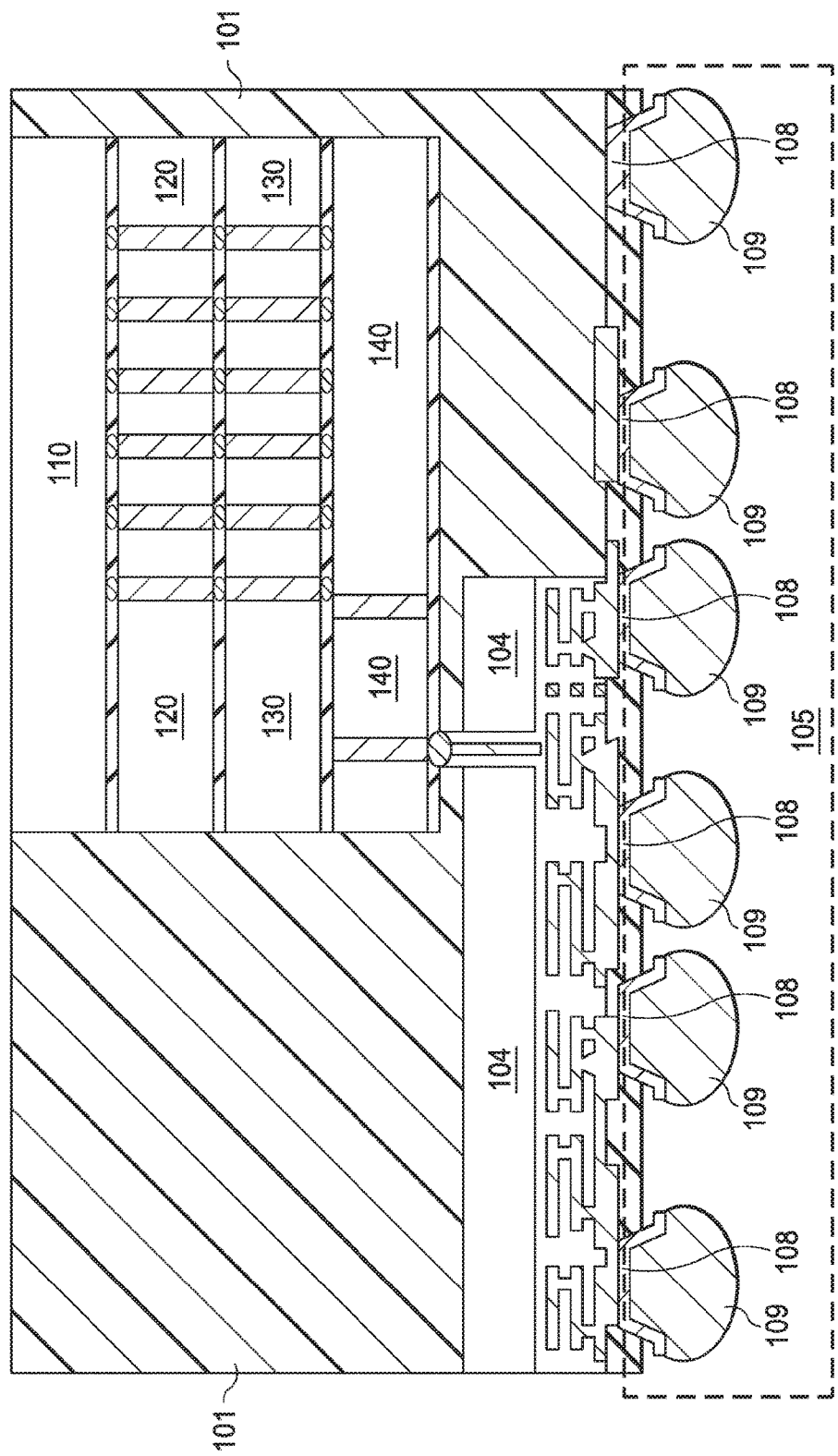

US 10,037,892 B2

MULTI-CHIP STRUCTURE AND METHOD OF FORMING SAME

This application is a continuation of U.S. patent application Ser. No. 15/085,837, filed on Mar. 30, 2016, entitled "Multi-Chip Structure and Method of Forming Same", which is a continuation of U.S. patent application Ser. No. 14/177,947, filed on Feb. 11, 2014, entitled "Multi-Chip Structure and Method of Forming Same", now U.S. Pat. No. 9,324,698, issued on Apr. 26, 2016, and claims the benefit of U.S. Provisional Application No. 61/865,411 filed on Aug. 13, 2013, entitled "Multi-Chip Structure and Method of Forming Same" which applications are incorporated herein by reference.

BACKGROUND

The semiconductor industry has experienced rapid growth due to improvements in the integration density of a variety of electronic components (e.g., transistors, diodes, resistors, capacitors, etc.). For the most part, this improvement in integration density has come from shrinking the semiconductor process node (e.g., shrink the process node towards the sub-20 nm node). As the demand for miniaturization, higher speed and greater bandwidth, as well as lower power consumption and latency has grown recently, there has grown a need for smaller and more creative packaging techniques of semiconductor dies.

As semiconductor technologies evolve, wafer level package based semiconductor devices have emerged as an effective alternative to further reduce the physical size of a semiconductor chip. There may be two signal routing mechanisms in a wafer level package based semiconductor device, namely a fan-in signal routing mechanism and a fan-out signal routing mechanism. In a semiconductor device having a fan-in signal routing mechanism, input and output pads of each die are limited to an area within the footprint of the semiconductor die. With the limited area of the die, the number of the input and output pads is limited due to the limitation of the pitch of the input and output pads.

In a semiconductor device having a fan-out signal routing mechanism, the input and output pads of a die can be redistributed to an area outside the area of the die. As such, the input and output pads can spread signals to a larger area than the area of the die and provide additional space for interconnects. As a result, the number of input and output pads of the semiconductor device can be increased.

In a fan-out structure, the signal redistribution can be implemented by using a redistribution layer. The redistribution layer may couple an input and output pad within the area of the die and another input and output pad outside the area of the die so that signals from the semiconductor die can be spread outside the footprint of the semiconductor die.

A molding compound layer may be formed over the semiconductor die. The molding compound layer may be formed of epoxy based resins and the like. A portion of the molding compound layer located from the edge of the die to the edge of the semiconductor device is commonly referred to as a fan-out area of the semiconductor device.

BRIEF DESCRIPTION OF THE DRAWINGS

For a more complete understanding of the present disclosure, and the advantages thereof, reference is now made to the following descriptions taken in conjunction with the accompanying drawings, in which:

FIG. 2 illustrates a cross sectional view of a semiconductor device after the first chip is mounted on a carrier in accordance with various embodiments of the present disclosure;

FIG. 3 illustrates a cross sectional view of the semiconductor device shown in FIG. 2 after the second chip is mounted on the first chip in accordance with various embodiments of the present disclosure;

FIG. 4 illustrates a cross sectional view of the semiconductor device shown in FIG. 3 after an encapsulation layer is formed over the carrier in accordance with various embodiments of the present disclosure;

FIG. 5 illustrates a cross sectional view of the semiconductor device shown in FIG. 4 after a grinding process is applied to the top surface of the encapsulation layer in accordance with various embodiments of the present disclosure;

FIG. 6 illustrates a cross sectional view of the semiconductor device shown in FIG. 5 after a redistribution layer is formed on top of the encapsulation layer in accordance with various embodiments of the present disclosure;

FIG. 7 illustrates a cross sectional view of the semiconductor device shown in FIG. 6 after a dielectric layer is formed on top of the encapsulation layer in accordance with various embodiments of the present disclosure;

FIG. 8 illustrates a cross sectional view of the semiconductor device shown in FIG. 7 after a plurality of UBM structures and interconnection bumps are formed in accordance with various embodiments of the present disclosure;

FIG. 9 illustrates a process of removing the carrier from the semiconductor device in accordance with various embodiments of the present disclosure; and FIGS. 10-20 illustrate other illustrative embodiments of the multi-chip semiconductor device in accordance with various embodiments of the present disclosure.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the presently embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the disclosure.

The present disclosure will be described with respect to embodiments in a specific context, namely a multi-chip semiconductor device with a fan-out structure. The embodiments of the disclosure may also be applied, however, to a variety of semiconductor devices and packages. Hereinafter, various embodiments will be explained in detail with reference to the accompanying drawings.

Figure 1:
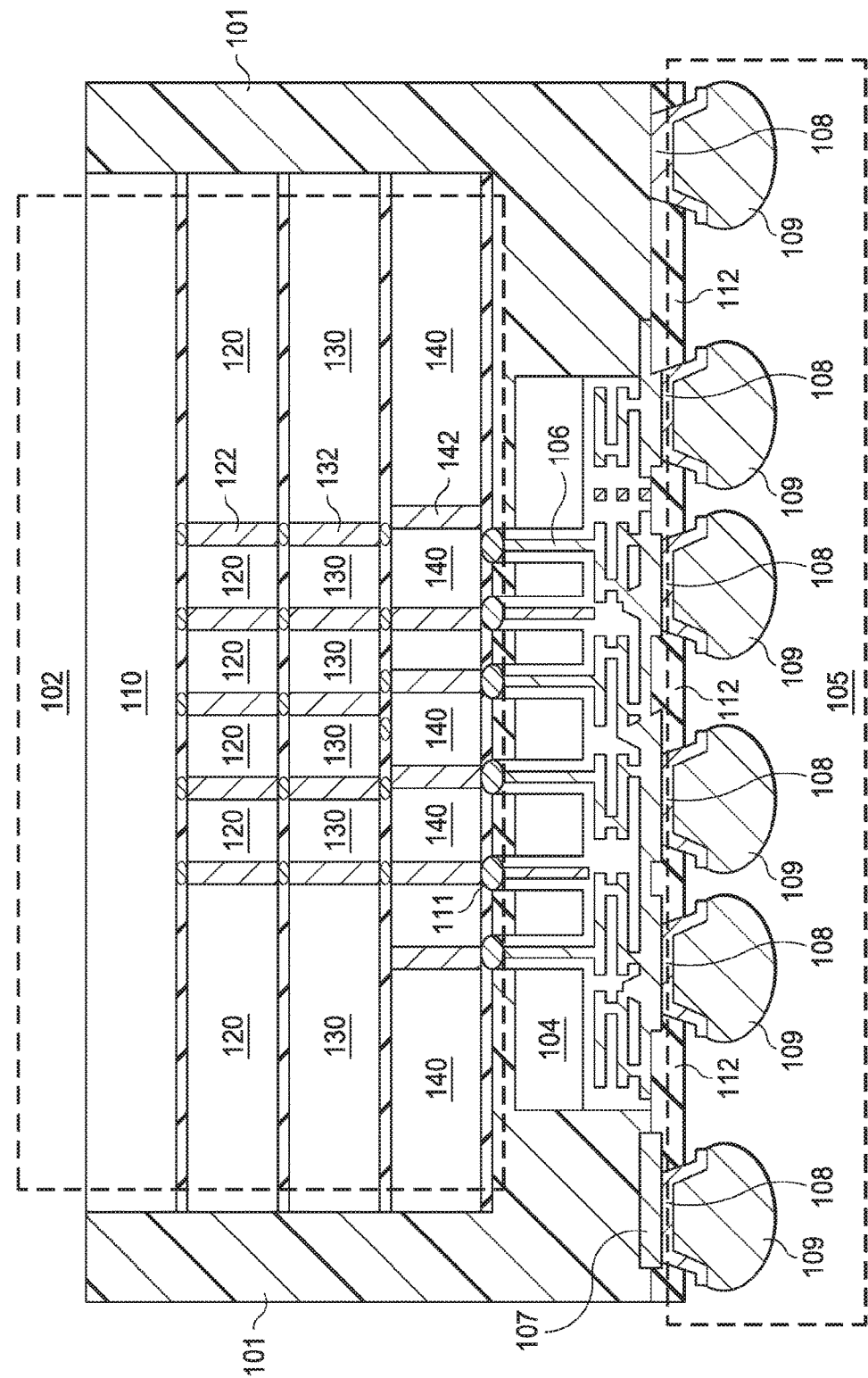
FIG. 1 illustrates a cross sectional view of a multi-chip semiconductor device in accordance with various embodiments of the present disclosure.

FIG. 1 illustrates a cross sectional view of a multi-chip semiconductor device in accordance with various embodiments of the present disclosure. The multi-chip semiconductor device 100 may include a first chip 102 and a second chip 104. In particular, the first chip 102 is stacked on top of the second chip 104. As shown in FIG. 1, the first chip 102 and the second chip 104 are bonded together through a joint structure formed by conductive bumps 111. The joint structure may be generated by a reflow process.

The first chip 102 may include a plurality of semiconductor dies stacked together. As shown in FIG. 1, the first chip 102 is formed by stacked semiconductor dies 110, 120, 130 and 140. There may be a plurality of through vias in each stacked semiconductor die (e.g., through vias 122 in the die 120, through vias 132 in the die 130 and through vias 142 in the die 140). The through vias 122, 132 and 132 are filled with conductive materials such as copper and the like. The through vias and conductive bumps placed between two adjacent stacked dies form a variety of conductive channels through which electronic circuits in the stacked semiconductor dies may be coupled to each other.

The stacked semiconductor dies of the first chip 102 may comprise memory dies, logic dies, processor dies and/or the like. It should be noted while FIG. 1 illustrates four stacked semiconductor dies in the first chip 102, this is merely an example. Likewise, the location of the through vias shown in FIG. 1 and the number of through vias in each stacked semiconductor die are merely illustrative and other configurations for electrically connecting the stacked dies are within the contemplated scope of the present disclosure.

In accordance with an embodiment, the second chip 104 may comprise a plurality of logic circuits such as central processing unit (CPU), graphics processing unit (GPU) and the like. Alternatively, the second chip 104 may comprise a plurality of memory circuits such as static random access memory (SRAM) and dynamic random access memory (DRAM) and the like. Furthermore, the second chip 104 may comprise integrated circuits for other suitable application such as radio frequency applications, image sensors, any combination thereof and/or the like. It should be noted that the second chip 104 may have many embodiments, which are also in the scope of the present disclosure.

In order to give a basic insight of the inventive aspects of various embodiments, the second chip 104 is drawn without details. However, it should be noted that the second chip 104 may comprise basic semiconductor layers such as active circuit layers, substrate layers, inter-layer dielectric (ILD) layers, inter-metal dielectric (IMD) layers (not shown respectively) and/or the like.

The second chip 104 may comprise a substrate. The substrate may be a silicon substrate. Alternatively, the substrate may be a silicon-on-insulator (SOI) substrate. The SOI substrate may comprise a layer of a semiconductor material (e.g., silicon, germanium and/or the like) formed over an insulator layer (e.g., buried oxide or the like), which is formed in a silicon substrate. In addition, other substrates that may be used include multi-layered substrates, gradient substrates, hybrid orientation substrates and/or the like.

The substrate may further comprise a variety of electrical circuits (not shown). The electrical circuits formed on the substrate may be any type of circuitry suitable for a variety of applications such as logic circuits. In some embodiments, the electrical circuits may include various n-type metal-oxide semiconductor (NMOS) and/or p-type metal-oxide semiconductor (PMOS) devices such as transistors, capacitors, resistors, diodes, photo-diodes, fuses and the like. The electrical circuits may be interconnected to perform one or more functions. The functions may include memory structures, processing structures, sensors, amplifiers, power distribution, input/output circuitry or the like.

One of ordinary skill in the art will appreciate that the above examples are provided for illustrative purposes only to further explain applications of the present disclosure and are not meant to limit the present disclosure in any manner.

The second chip 104 may further comprise a plurality of through vias 106. In some embodiments, the through vias 106 are through-substrate vias (TSVs) or through-silicon vias (TSVs). The through vias 106 may be filled with a conductive material such as copper, tungsten and/or the like. The active circuit layers (not shown) of the second chip 104 may be coupled to the active circuits of the first chip 102 and external circuits (not shown) through the through vias 106.

As shown in FIG. 1, both the first chip 102 and the second chip 104 are embedded in an encapsulation layer 101. In some embodiments, at least one edge of the first chip 102 (e.g., the left edge of the first chip 102) is not vertically aligned with a corresponding edge of the second chip 104 (e.g., the left edge of the second chip 104).

FIG. 1 further illustrates that a top surface of the first chip 102 is exposed outside the encapsulation layer 101. In accordance with some embodiments, the encapsulation layer 101 may be a molding compound layer formed of suitable underfill materials. Throughout the description, the encapsulation layer 101 may be alternatively referred to as a molding compound layer 101.

The molding compound layer 101 may fill the gaps between the first chip 102 and the second chip 104. The regions beyond the edges of the second chip 104 are commonly referred to as fan-out regions. As shown in FIG. 1, there may be two fan-out regions. A first fan-out region is the molding compound region beyond the left edge of the second chip 104. Likewise, the second fan-out region is the molding compound region beyond the right edge of the second chip 104.

In some embodiments, the molding compound layer 101 may be formed of suitable materials such as an epoxy. The epoxy may be applied in a liquid form, and may harden after a curing process. In alternative embodiments, the molding compound layer 101 may be formed of curable materials such as polymer based materials, resin based materials, polyimide, epoxy and any combinations of thereof. The molding compound layer 101 can be formed by any suitable dispense techniques.

It should further be noted that the fan-out regions shown in FIG. 1 is merely an example. By shifting the first chip 102 and/or the second chip 104, the multi-chip semiconductor device 100 may be of different fan-out regions. The detailed structures of such fan-out regions will be described below with respect to FIGS. 13-20.

The multi-chip semiconductor device 100 may further comprise a fan-out structure 105. As shown in FIG. 1, the fan-out structure 105 includes a redistribution layer 107 formed over the molding compound layer 101, a dielectric layer 112 formed over the redistribution layer 107 and a plurality of bumps 109.

Throughout the description, the side of the fan-out structure 105 having the redistribution layer 107 is alternatively referred to as the first side of the fan-out structure 105. On the other hand, the side of the fan-out structure 105 not having the redistribution layer 107 is referred to as the second side of the fan-out structure 105.

As shown in FIG. 1, the redistribution layer 107 is formed on a front side of the second chip 104. In particular, the redistribution layer 107 extends beyond the edges of the second chip 104 on the top surface of the encapsulation layer 101. The redistribution layer 107 provides a conductive path between TSVs (e.g., through vias 106) and the bumps subsequently formed over the second side of the fan-out structure 105. The active circuit layer (not shown) of the second chip 104 may be bridged by the redistribution layer so that the active circuit layer of the semiconductor dies (e.g., the second chip 104) can be electrically coupled to external circuits. The redistribution layer 107 may be formed of metal materials such as aluminum, aluminum alloys, copper or copper alloys and the like.

The dielectric layer 112 is formed over the redistribution layer 107. In some embodiments, the dielectric layer 112 is formed of a photo-sensitive material such as polybenzoxazole (PBO), polyimide, benzocyclobutene (BCB), any combinations thereof and/or the like, which may be easily patterned using a lithography mask. In alternative embodiments, the dielectric layer 112 may be formed of a nitride such as silicon nitride, an oxide such as silicon oxide, phosphosilicate glass (PSG), borosilicate glass (BSG), boron-doped phosphosilicate glass (BPSG), any combinations thereof and/or the like.

The dielectric layer 112 may be formed by suitable fabrication techniques such as such as spinning, chemical vapor deposition (CVD), and plasma enhanced CVD (PECVD) and/or the like. It should also be noted that one skilled in the art will recognize that the dielectric layer 112 may further comprise a plurality of dielectric layers.

The bumps 109 are formed on the second side of the fan-out structure 105. There may be a plurality of under bump metallization (UBM) structures 108 formed underneath the bumps 109. The detailed formation processes of the bumps 109 and the UBM structures 108 will be described below with respect to FIG. 8.

One advantageous feature of the multi-chip semiconductor device 100 shown in FIG. 1 is that the fan-out structure 105 helps the multi-chip semiconductor device 100 achieve better thermal performance, low shrinkage and warpage, smaller form factor and cost saving on using a reduced number of bumps.

FIGS. 2-9 illustrate intermediate steps of fabricating the multi-chip semiconductor device shown in FIG. 1 in accordance with various embodiments of the present disclosure. It should be noted that the fabrication steps as well as the multi-chip semiconductor device shown in FIGS. 2-9 are merely an example. A person skilled in the art will recognize there may be many alternatives, variations and modifications.

Figure 2:
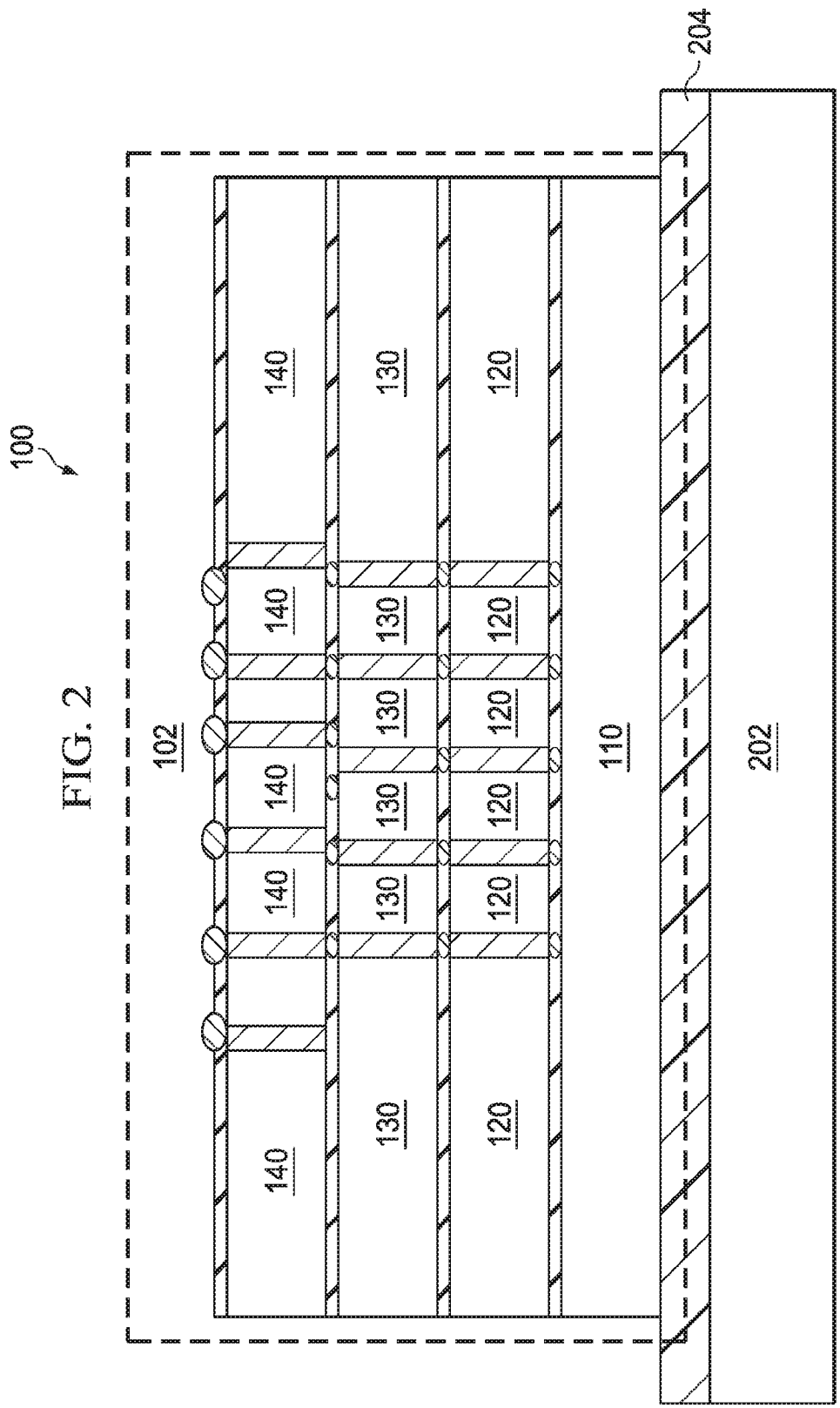
FIGS. 2-9 illustrate intermediate steps of fabricating the multi-chip semiconductor device shown in FIG. 1 in accordance with various embodiments of the present disclosure.

FIG. 2 illustrates a cross sectional view of a semiconductor device after the first chip is mounted on a carrier in accordance with various embodiments of the present disclosure. A carrier 202 may be employed to prevent the semiconductor device from cracking, warping, breaking and the like. In addition, the carrier 202 may help to form a fan-out structure through a molding compound layer formed over the carrier 202.

An auxiliary layer 204 is formed on top of the carrier 202. In some embodiments, the auxiliary layer 204 may include a release layer and an adhesive layer (not shown respectively). The release layer may be formed of suitable materials such as polymer and/or the like. The release layer may be UV-curable. In some embodiments, the release layer may be spin-coated on the carrier 202.

The adhesive layer may be spin-coated on the release layer. The adhesive layer may be formed of suitable materials such as polymer and/or the like. In alternative embodiments, the adhesive layer may be suitable tapes such as die attach film (DAF), non-conductive film (NCF) and/or the like. The adhesive layer may be removed by using chemical solvent, chemical mechanical polishing (CMP) and/or the like.

The first chip 102 may be mounted on the carrier through a pick-and-place process. In particular, the first chip 102 is picked and placed on top of the carrier 202. The first chip 102 is bonded on the carrier 202 through the adhesive layer. It should be noted that while FIG. 2 illustrates the first chip 102 may comprise four semiconductor dies, the first chip 102 may accommodate any number of semiconductor dies.

Figure 3:
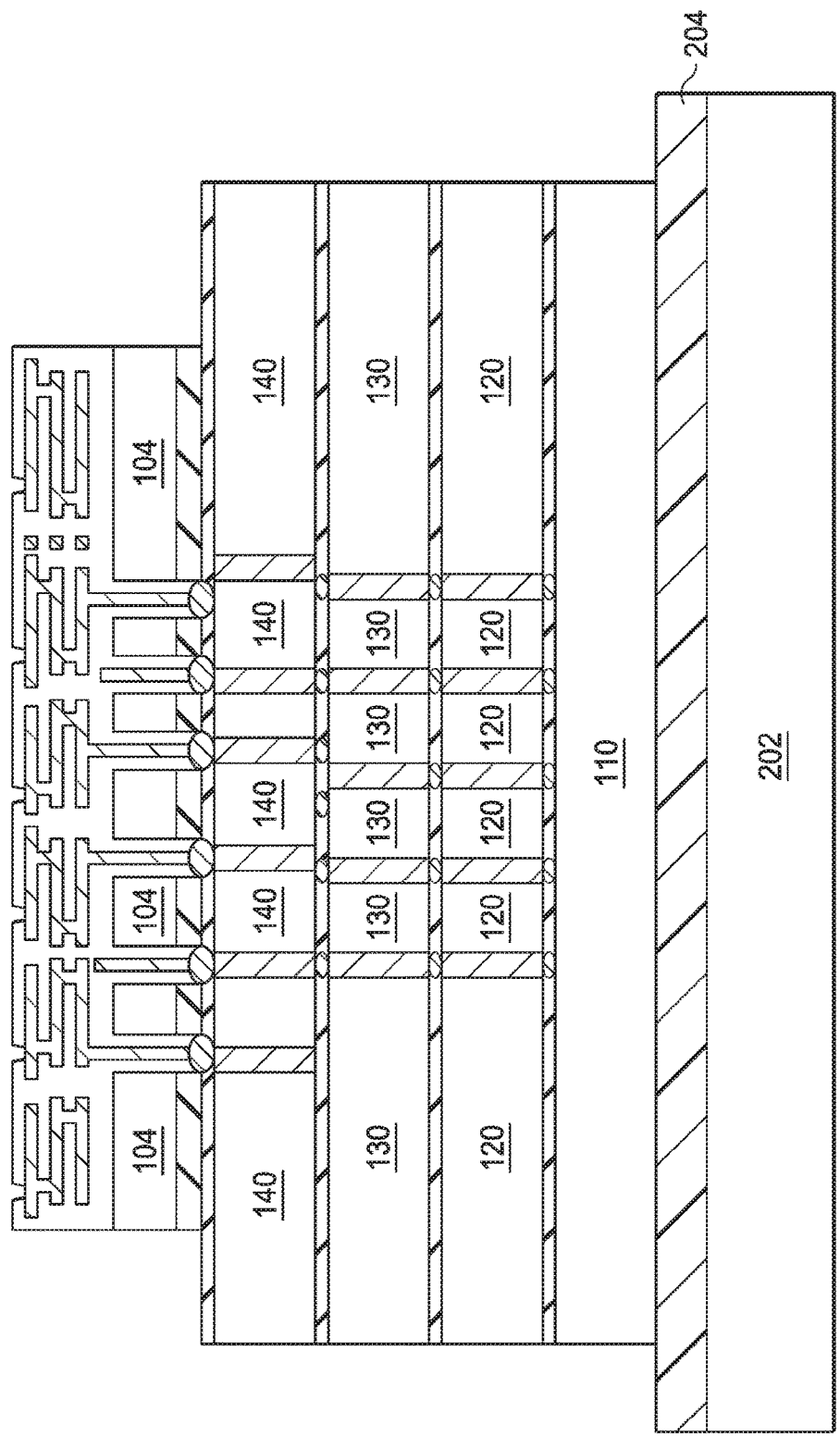

FIG. 3 illustrates a cross sectional view of the semiconductor device shown in FIG. 2 after the second chip is mounted on the first chip in accordance with various embodiments of the present disclosure. The second chip 104 may be bonded on the first chip 102 through a reflow process. The reflow process is employed to form a joint structure between the first chip 102 and the second chip 104.

It should be noted while FIG. 3 illustrates one semiconductor die (e.g., second chip 104) stacked on top of the first chip 102, this is merely an example. One skilled in the art will recognize that there may be many variations, alternatives and modifications. For example, additional dies may be stacked on top of the second chip 104.

Figure 4:
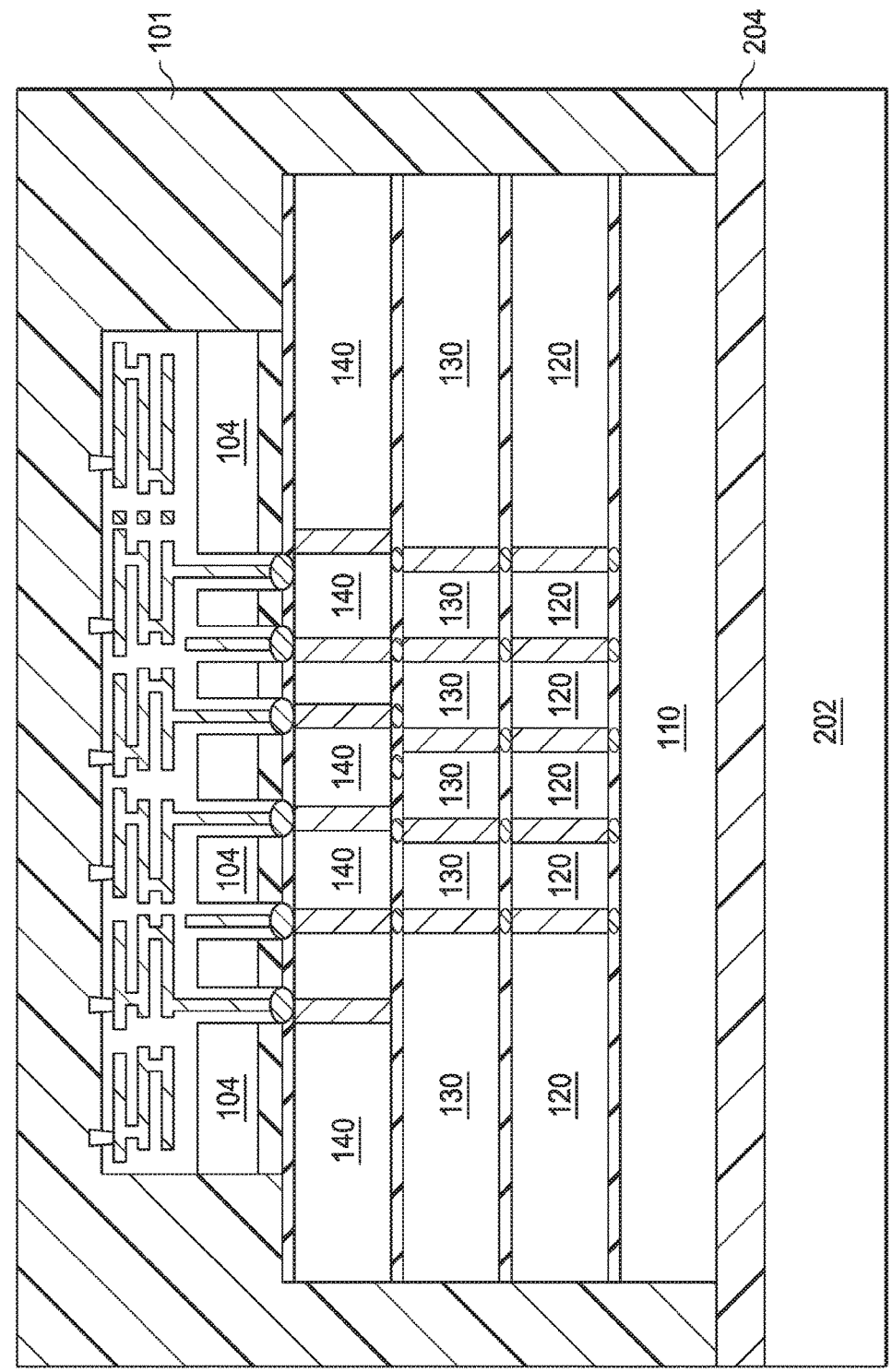

FIG. 4 illustrates a cross sectional view of the semiconductor device shown in FIG. 3 after an encapsulation layer is formed over the carrier in accordance with various embodiments of the present disclosure. The encapsulation layer 101 is formed over the carrier 202 as shown in FIG. 4. As a result, the top surfaces of first chip 102 and second chip 104 are covered by the encapsulation layer 101.

In accordance with some embodiments, the encapsulation layer 101 may be a molding compound layer formed of suitable underfill materials. In some embodiments, the underfill material layer may be formed of an epoxy. The epoxy may be applied in a liquid form, and may harden after a curing process. In alternative embodiments, the underfill material layer may be formed of curable materials such as polymer based materials, resin based materials, polyimide, epoxy and any combinations of thereof. The encapsulation layer 101 can be formed by any suitable dispense techniques.

Figure 5:
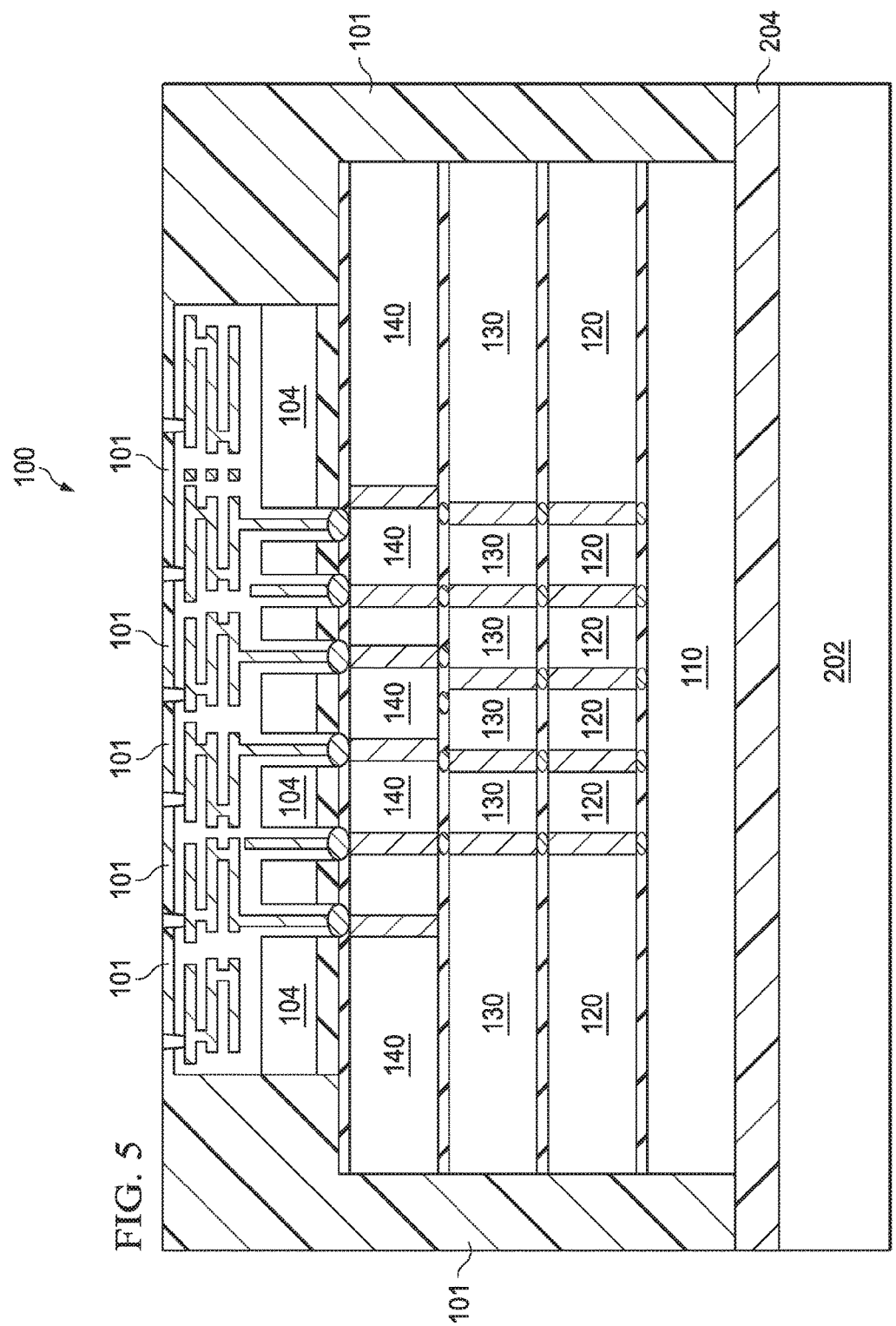

FIG. 5 illustrates a cross sectional view of the semiconductor device shown in FIG. 4 after a grinding process is applied to the top surface of the encapsulation layer in accordance with various embodiments of the present disclosure. The top surface of the encapsulation layer 101 undergoes a grinding process. The grinding process can employ a mechanical grinding process, a chemical polishing process, an etching process, any combinations thereof and/or the like.

As shown in FIG. 5, the grinding process is applied to the top surface of the encapsulation layer 101 until the top surface of the second chip 104 becomes exposed. In some embodiments, the top surface of the interconnect structure of the second chip 104 may be substantially planar with the top surface of the encapsulation layer 101. Thus, the interconnect structure may be exposed outside the encapsulation layer 101 so that electrical contacts such as redistribution layers, bumps and/or the like may be formed on the interconnect structure of the second chip 104.

Figure 6:
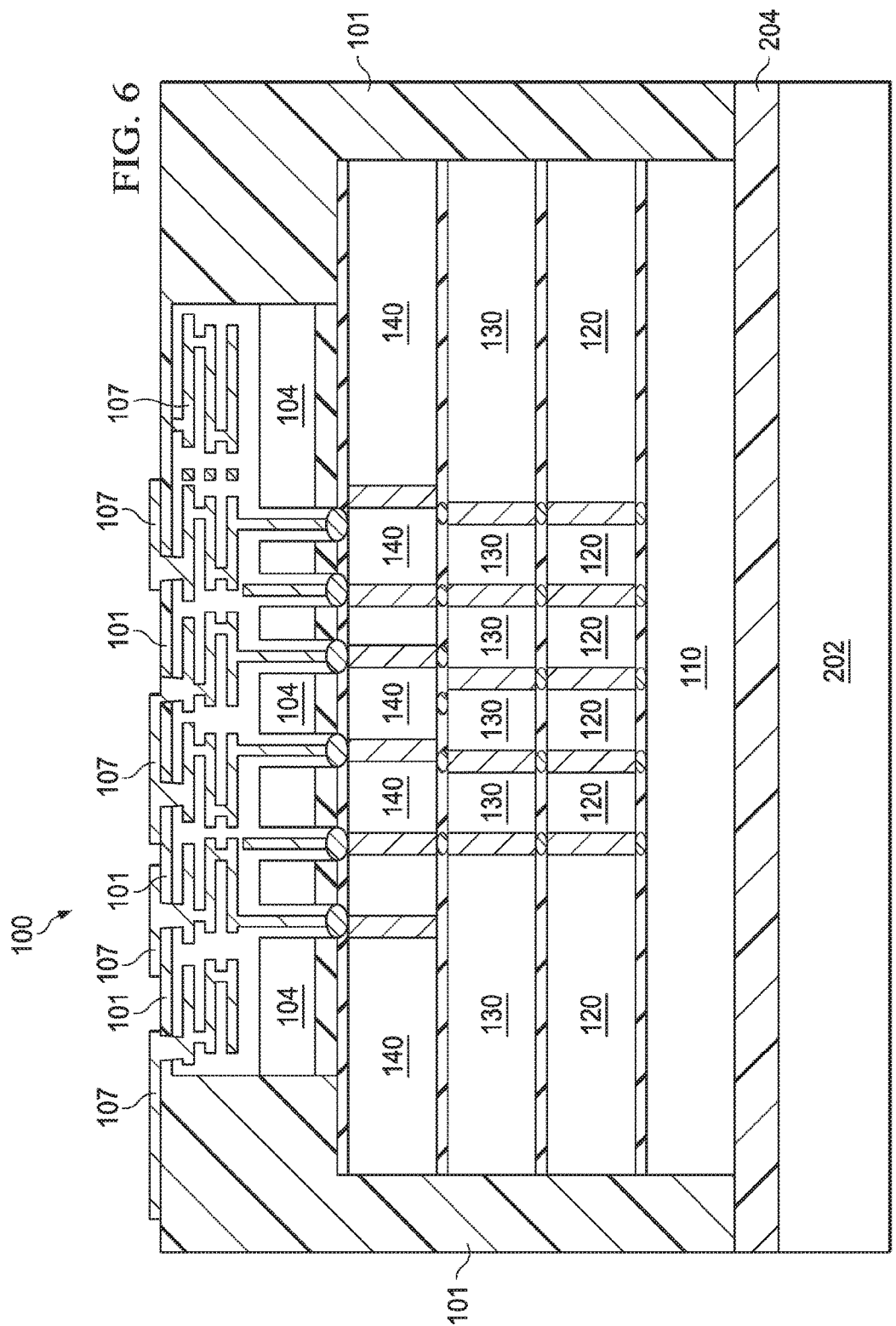

FIG. 6 illustrates a cross sectional view of the semiconductor device shown in FIG. 5 after a redistribution layer is formed on top of the encapsulation layer in accordance with various embodiments of the present disclosure. In some embodiments, the redistribution layer 107 may extend beyond the edges of the second chip 104. Accordingly, the resulting structure is a fan-out structure.

In some embodiments, the redistribution layer 107 may be formed by depositing a metal layer and subsequently patterning the metal layer. In alternative embodiments, the redistribution layer 107 may be formed using damascene processes. Furthermore, the redistribution layer 107 may be formed using, for example, a deposition method such as Physical Vapor Deposition (PVD). The redistribution layer 107 may comprise aluminum, copper, tungsten, and/or alloys thereof.

Figure 7:
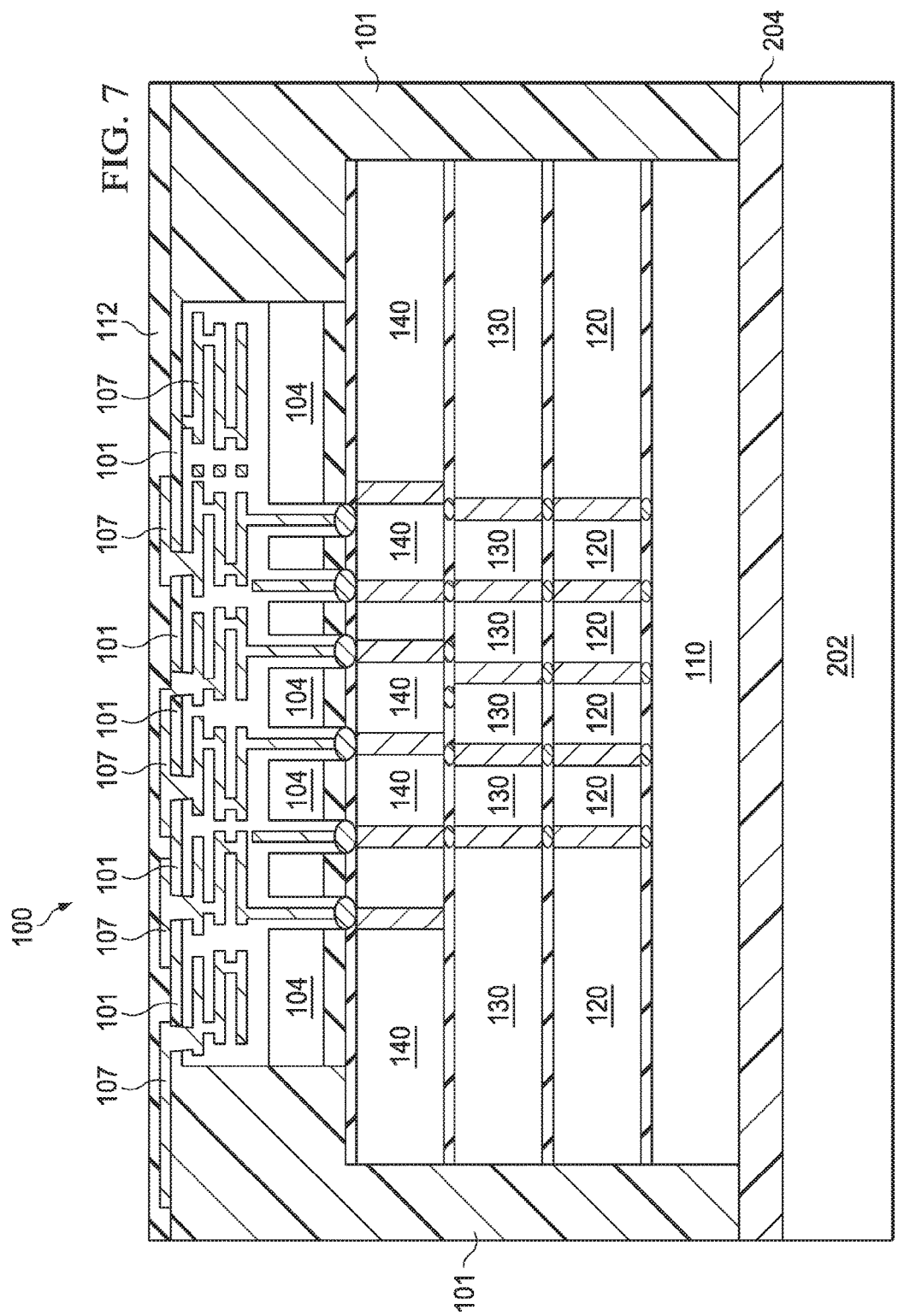

FIG. 7 illustrates a cross sectional view of the semiconductor device shown in FIG. 6 after a dielectric layer is formed on top of the encapsulation layer in accordance with various embodiments of the present disclosure. In some embodiments, the dielectric layer 112 is formed of a photosensitive material such as PBO, polyimide, BCB, any combinations thereof and/or the like.

In alternative embodiments, the dielectric layer 112 may be made of one or more suitable dielectric materials such as silicon oxide, silicon nitride, low-k dielectrics such as carbon doped oxides, extremely low-k dielectrics such as porous carbon doped silicon dioxide, a polymer and/or the like. The dielectric layer 112 may be formed through a process such as CVD, although any suitable process may be utilized.

Figure 8:
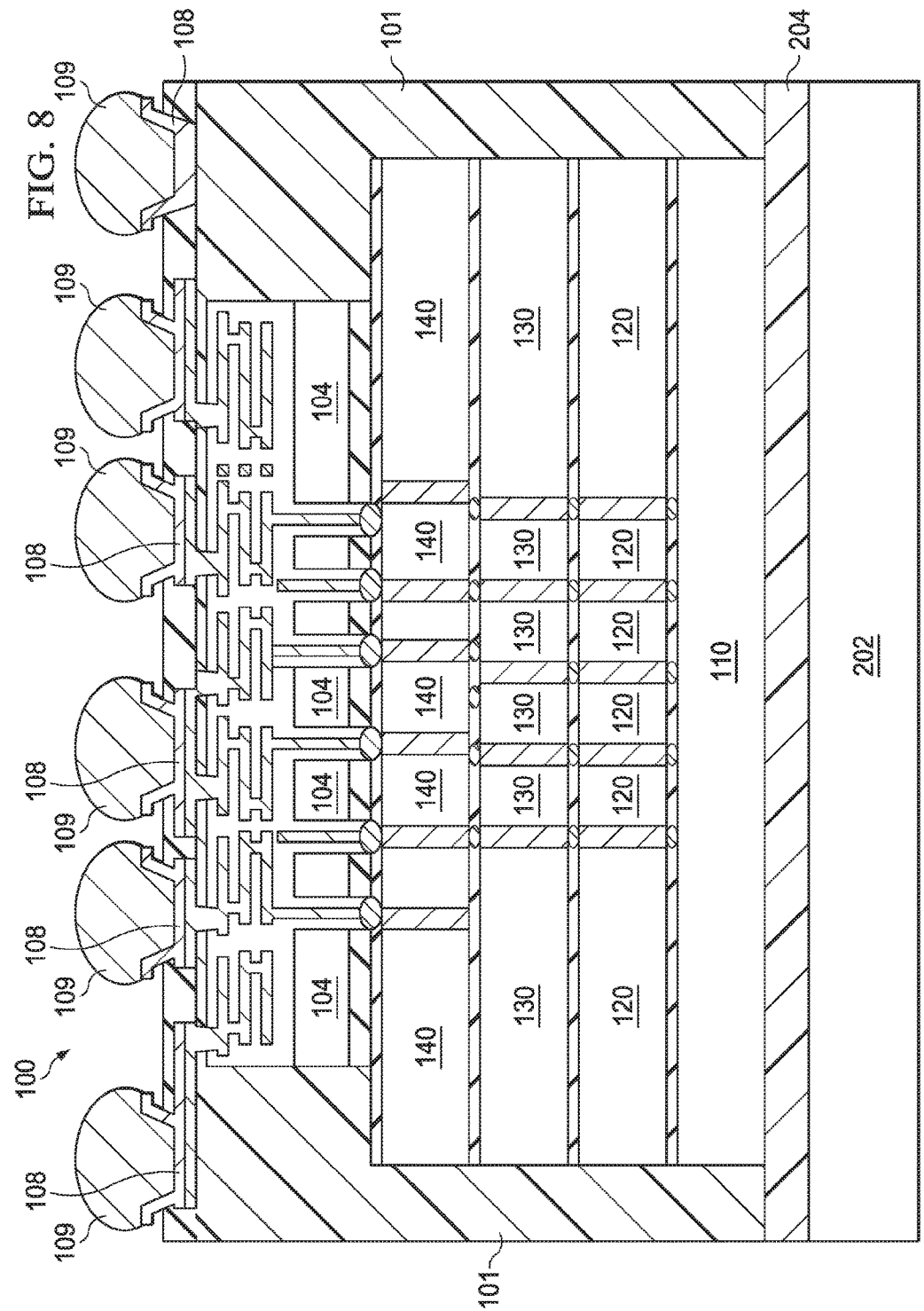

FIG. 8 illustrates a cross sectional view of the semiconductor device shown in FIG. 7 after a plurality of UBM structures and interconnection bumps are formed in accordance with various embodiments of the present disclosure. The plurality of UBM structures 108 are formed in the dielectric layer 112 and over the redistribution layer 107. The UBM structures 108 help to prevent diffusion between the solder balls and the integrated circuits of the semiconductor device, while providing a low resistance electrical connection.

The bumps 109 are input/output (I/O) pads or interconnection bumps of the semiconductor device. In some embodiments, the bumps 109 may be formed of copper. In accordance with another embodiment, the bumps 109 may be a plurality of solder balls 109. In some embodiments, the solder balls 109 may comprise SAC405. SAC405 comprises 95.5% Sn, 4.0% Ag and 0.5% Cu. Alternatively, the bumps 109 may be a plurality of land grid array (LGA) pads.

Figure 9:
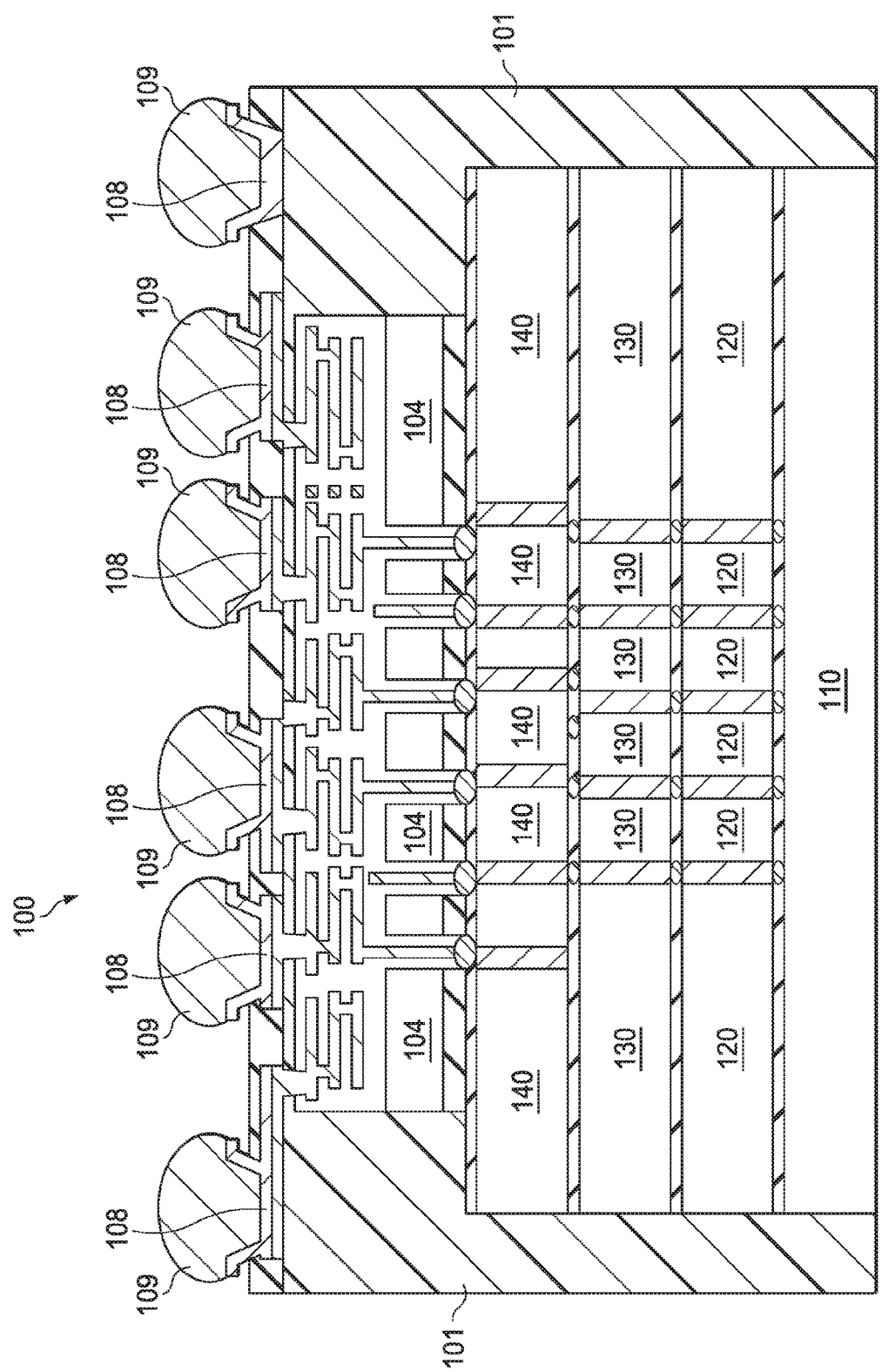

FIG. 9 illustrates a process of removing the carrier from the semiconductor device in accordance with various embodiments of the present disclosure. In accordance with an embodiment, the carrier 202 can be detached from the multi-chip semiconductor device 100. A variety of detaching processes may be employed to separate the multi-chip semiconductor device 100 from the carrier 202. The variety of detaching processes may comprise a chemical solvent, a UV exposure, a laser ablation process and/or the like.

Figure 10:
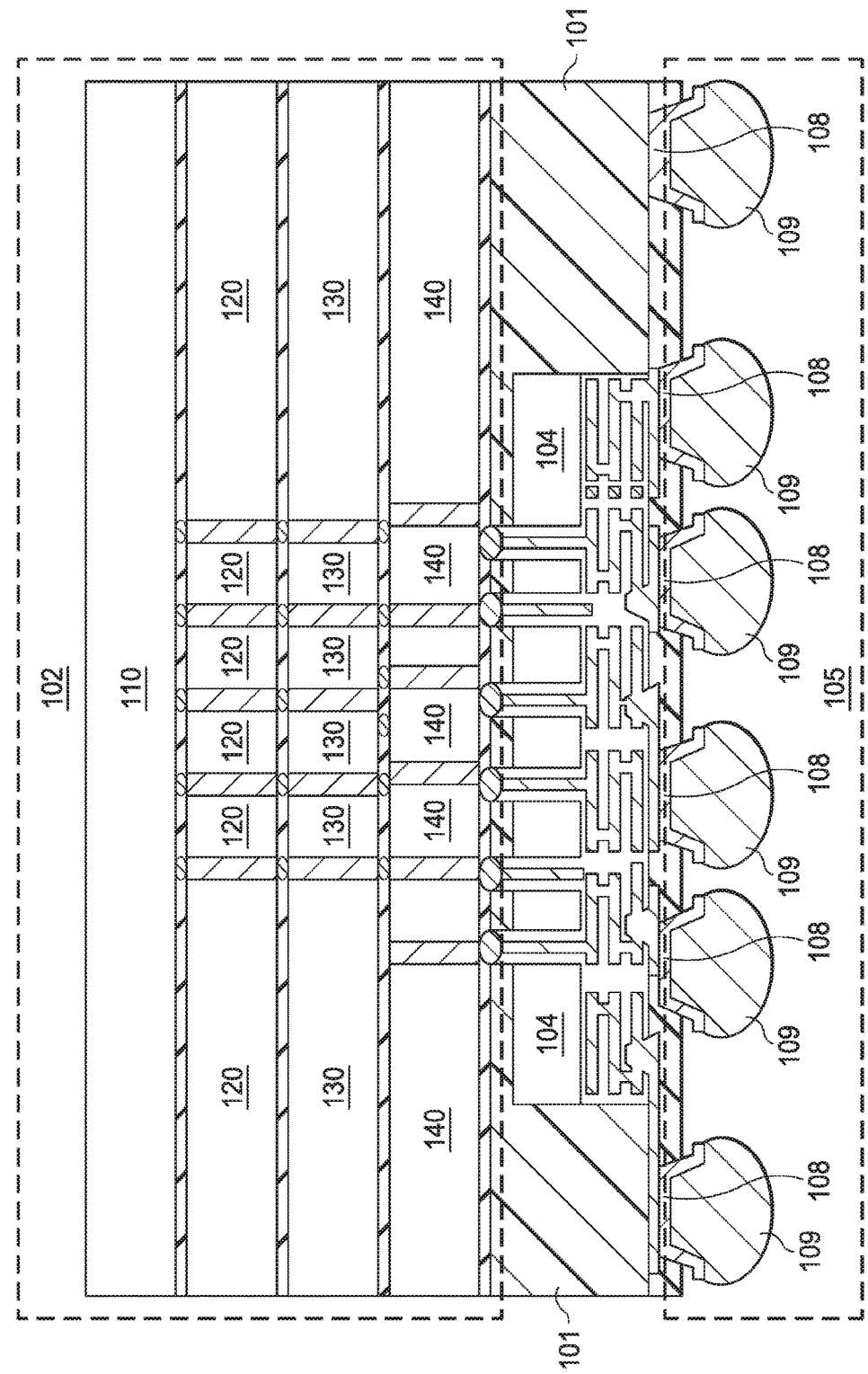

FIG. 10 illustrates a cross sectional view of another multi-chip semiconductor device with a fan-out structure in accordance with various embodiments of the present disclosure. The multi-chip semiconductor device 1000 is similar to the multi-chip semiconductor device 100 shown in FIG. 1 except that the length of the first chip 102 is the same as the length of the fan-out structure 105. As such, the encapsulation layer 101 is located between the first chip 102 and the fan-out structure 105. The fabrication process of the multi-chip semiconductor device 1000 is similar to that of multi-chip semiconductor device 100, and hence is not discussed herein to avoid repetition.

Figure 11:
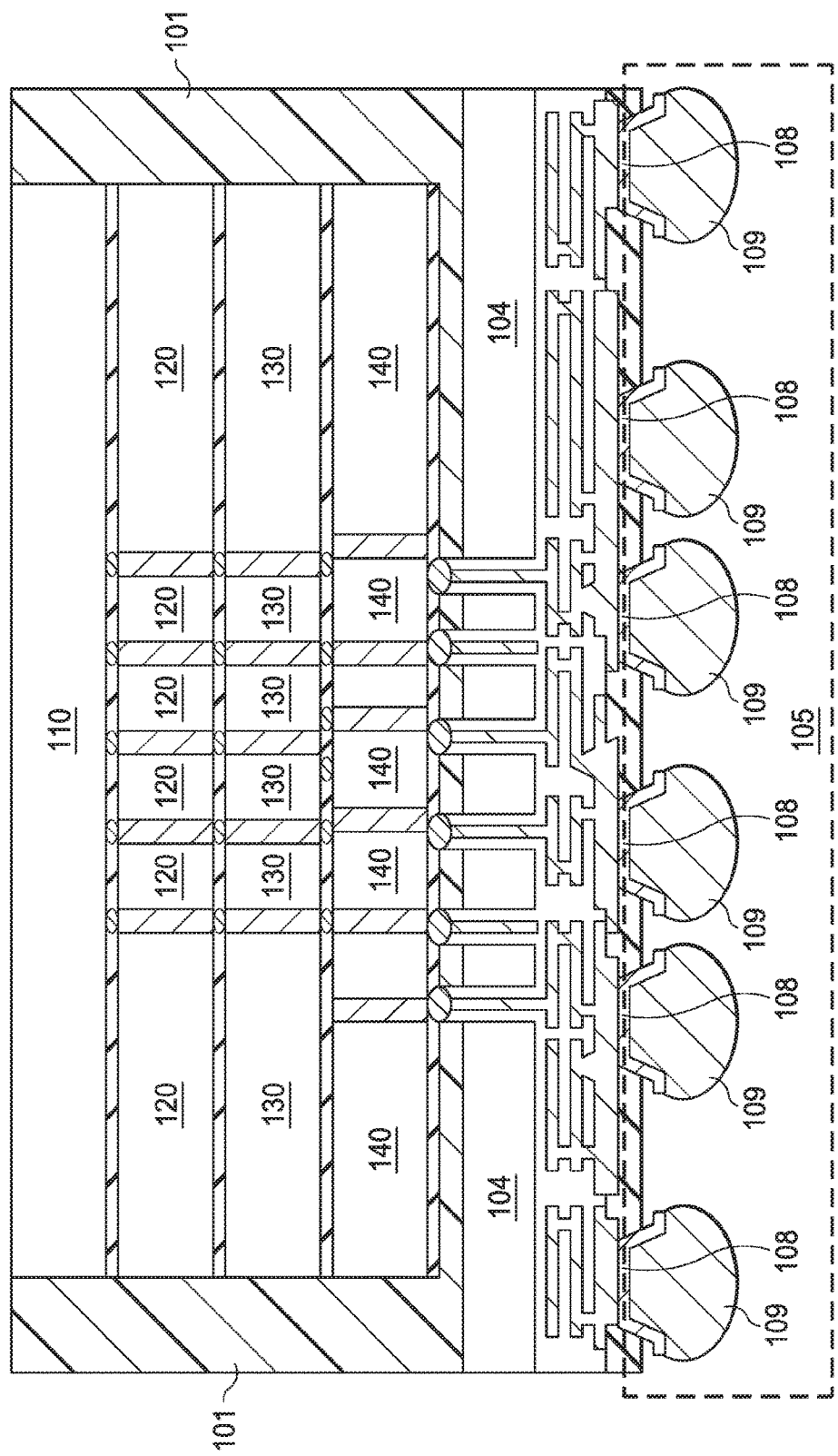

FIG. 11 illustrates a cross sectional view of another multi-chip semiconductor device with a fan-out structure in accordance with various embodiments of the present disclosure. The multi-chip semiconductor device 1100 is similar to the multi-chip semiconductor device 100 shown in FIG. 1 except that the length of the second chip 104 is the same as the length of the fan-out structure 105. The fabrication process of the multi-chip semiconductor device 1100 is similar to that of multi-chip semiconductor device 100, and hence is not discussed herein to avoid repetition.

Figure 12:
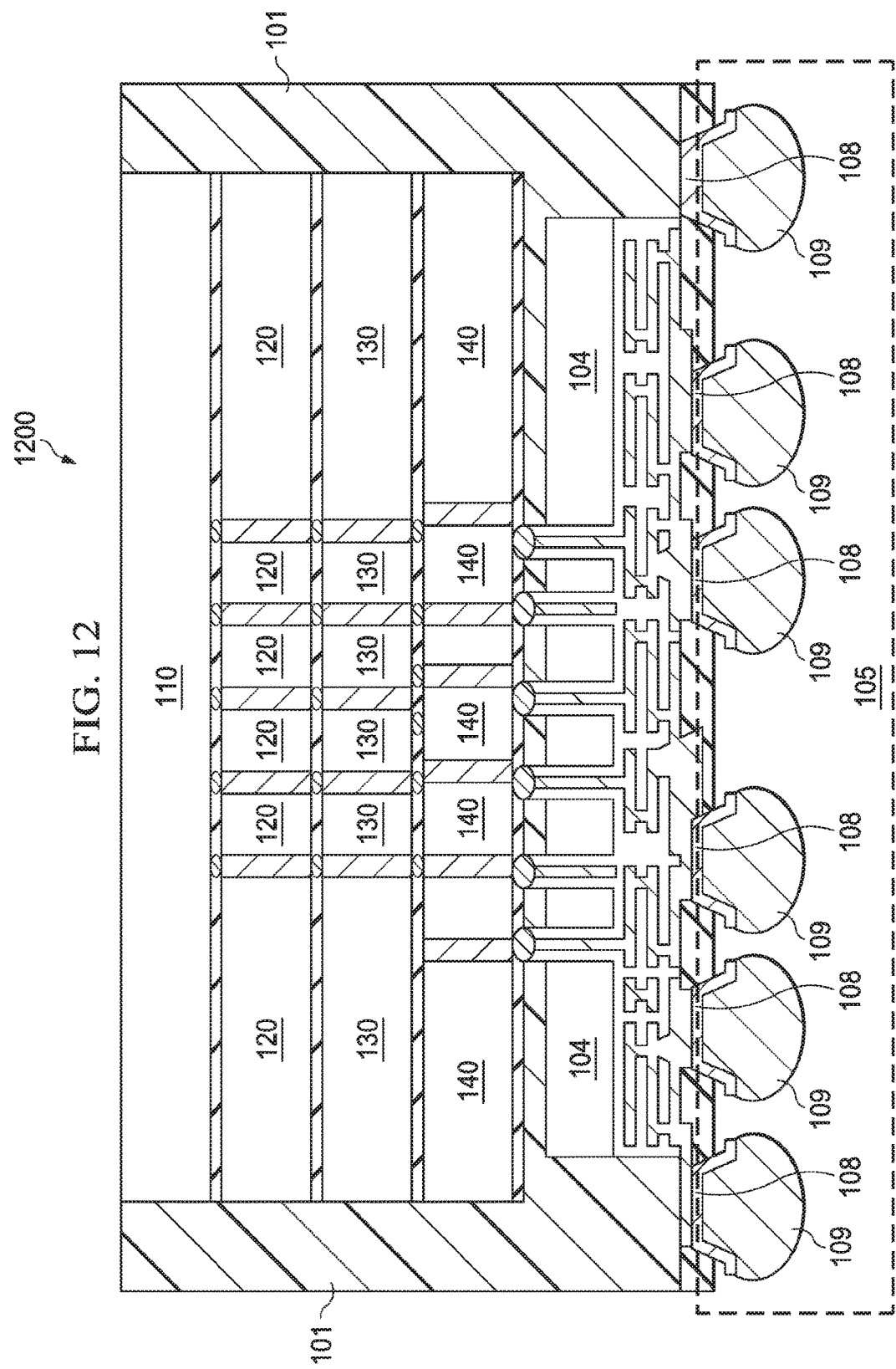

FIG. 12 illustrates a cross sectional view of another multi-chip semiconductor device with a fan-out structure in accordance with various embodiments of the present disclosure. The multi-chip semiconductor device 1200 is similar to the multi-chip semiconductor device 100 shown in FIG. 1 except that the length of the second chip 104 is greater than the length of the first chip 102. The fabrication process of the multi-chip semiconductor device 1200 is similar to that of multi-chip semiconductor device 100, and hence is not discussed herein to avoid repetition.

Figure 13:
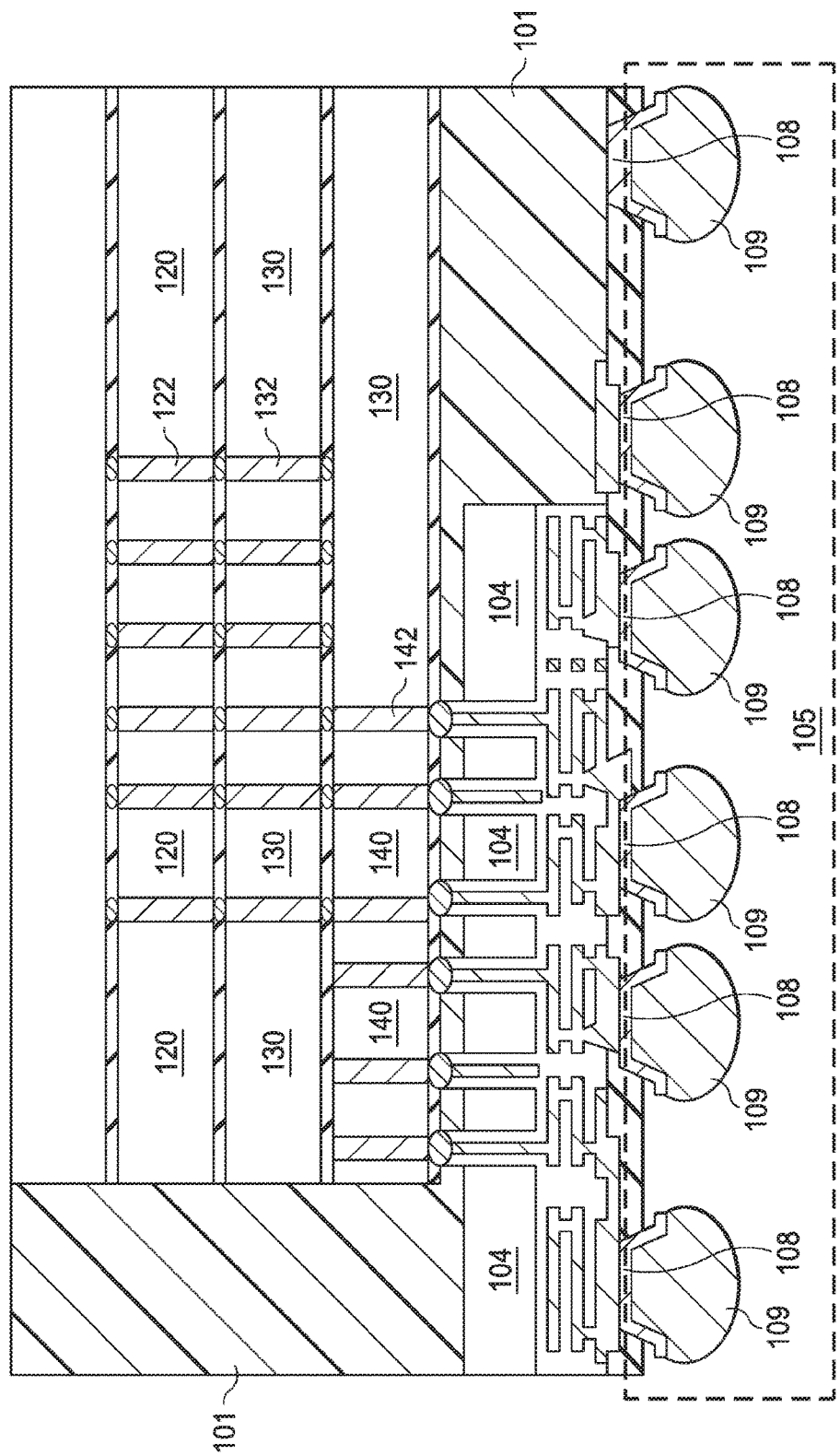

FIG. 13 illustrates a cross sectional view of another multi-chip semiconductor device with a fan-out structure in accordance with various embodiments of the present disclosure. The multi-chip semiconductor device 1300 is similar to the multi-chip semiconductor device 100 shown in FIG. 1 except that there may be a shift between the first chip 102 and the second chip 104. In particular, the centerline of the first chip 102 is not aligned with the centerline of the second chip 104.

As shown in FIG. 13, in comparison with the multi-chip semiconductor device 100 shown in FIG. 1, the first chip 102 is shifted to the right edge of the fan-out structure 105. As a result, there may be one fan-out region, which is the molding compound region located between the fan-out structure 105 and the first chip 102.

As shown in FIG. 13, the right edge of the first chip 102 is aligned with the right edge of the fan-out structure 105. Likewise, the second chip 104 is shifted to the left edge of the fan-out structure 105. The left edge of the second chip 104 is aligned with the left edge of the fan-out structure 105. The fabrication process of the multi-chip semiconductor device 1300 is similar to that of multi-chip semiconductor device 100, and hence is not discussed herein to avoid repetition.

Figure 14:
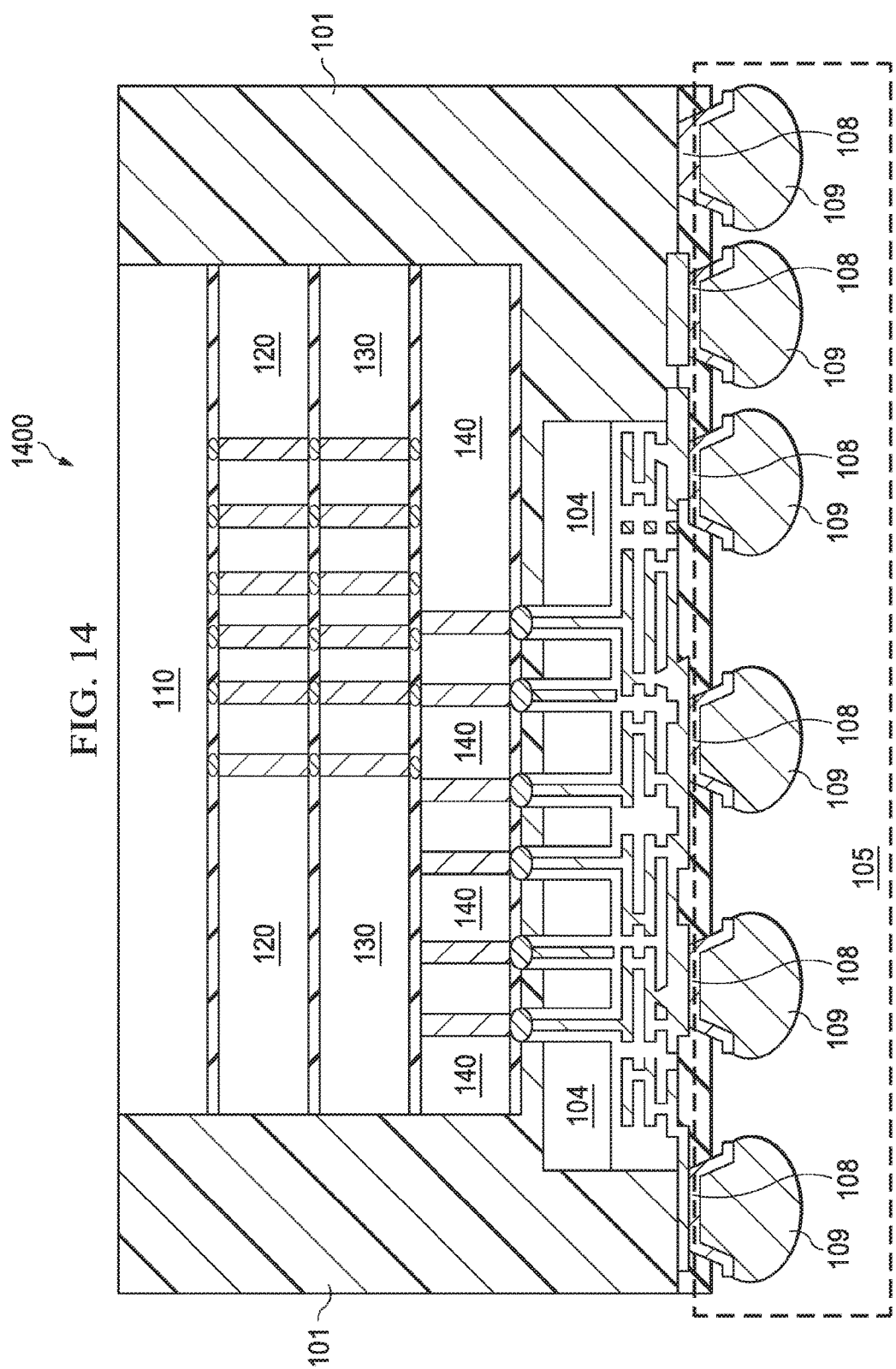

FIG. 14 illustrates a cross sectional view of another multi-chip semiconductor device with a fan-out structure in accordance with various embodiments of the present disclosure. The multi-chip semiconductor device 1400 is similar to the multi-chip semiconductor device 1300 shown in FIG. 13 except that both the first chip 102 and the second chip 104 are not shifted to the edges of the fan-out structure 105. The fabrication process of the multi-chip semiconductor device 1300 is similar to that of multi-chip semiconductor device 100, and hence is not discussed herein to avoid repetition.

Figure 15:
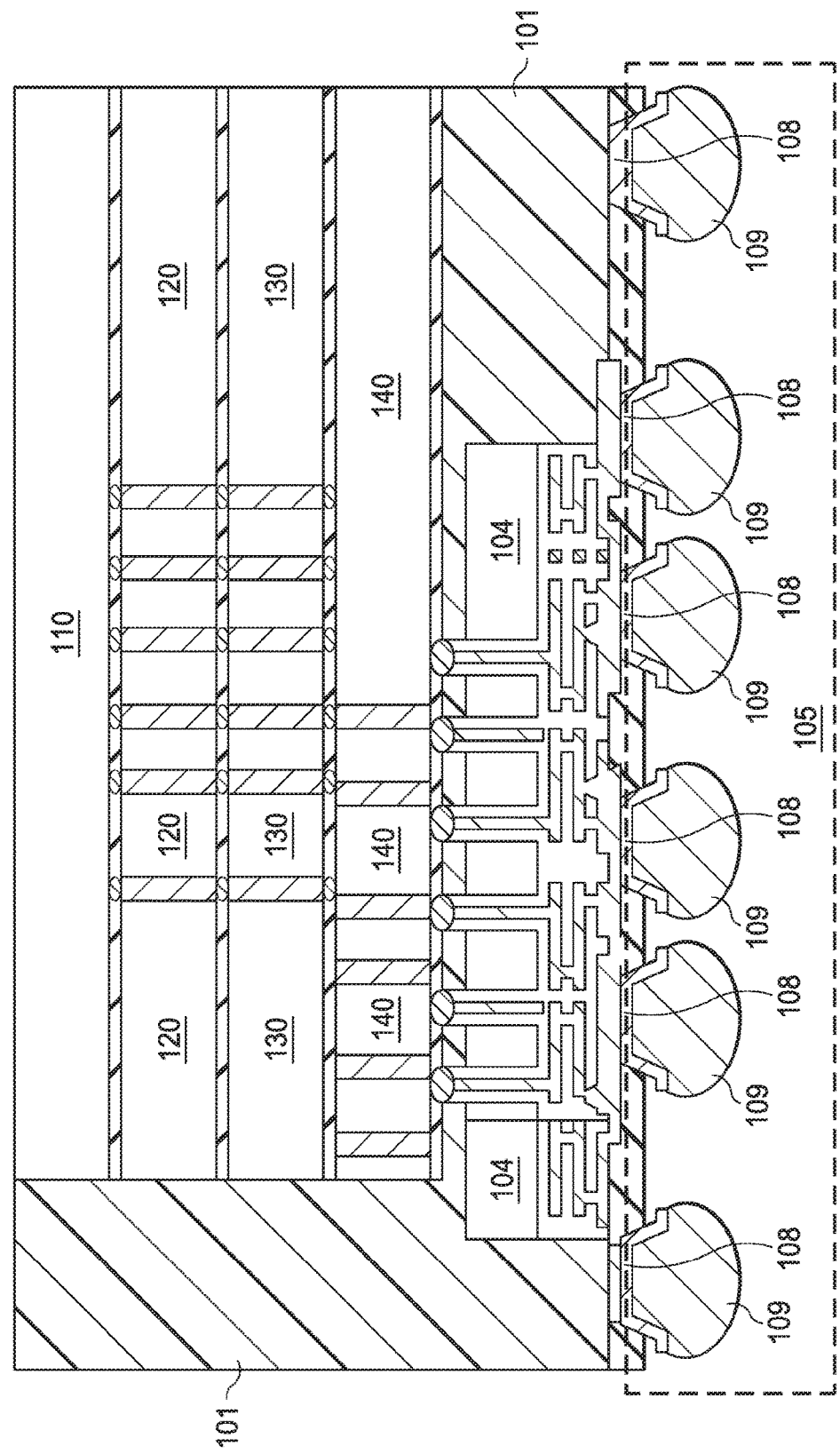

FIG. 15 illustrates a cross sectional view of another multi-chip semiconductor device with a fan-out structure in accordance with various embodiments of the present disclosure. The multi-chip semiconductor device 1500 is similar to the multi-chip semiconductor device 1300 shown in FIG. 13 except that the second chip 104 is not shifted to the edge of the fan-out structure 105. The fabrication process of the multi-chip semiconductor device 1300 is similar to that of multi-chip semiconductor device 100, and hence is not discussed herein to avoid repetition.

Figure 16:
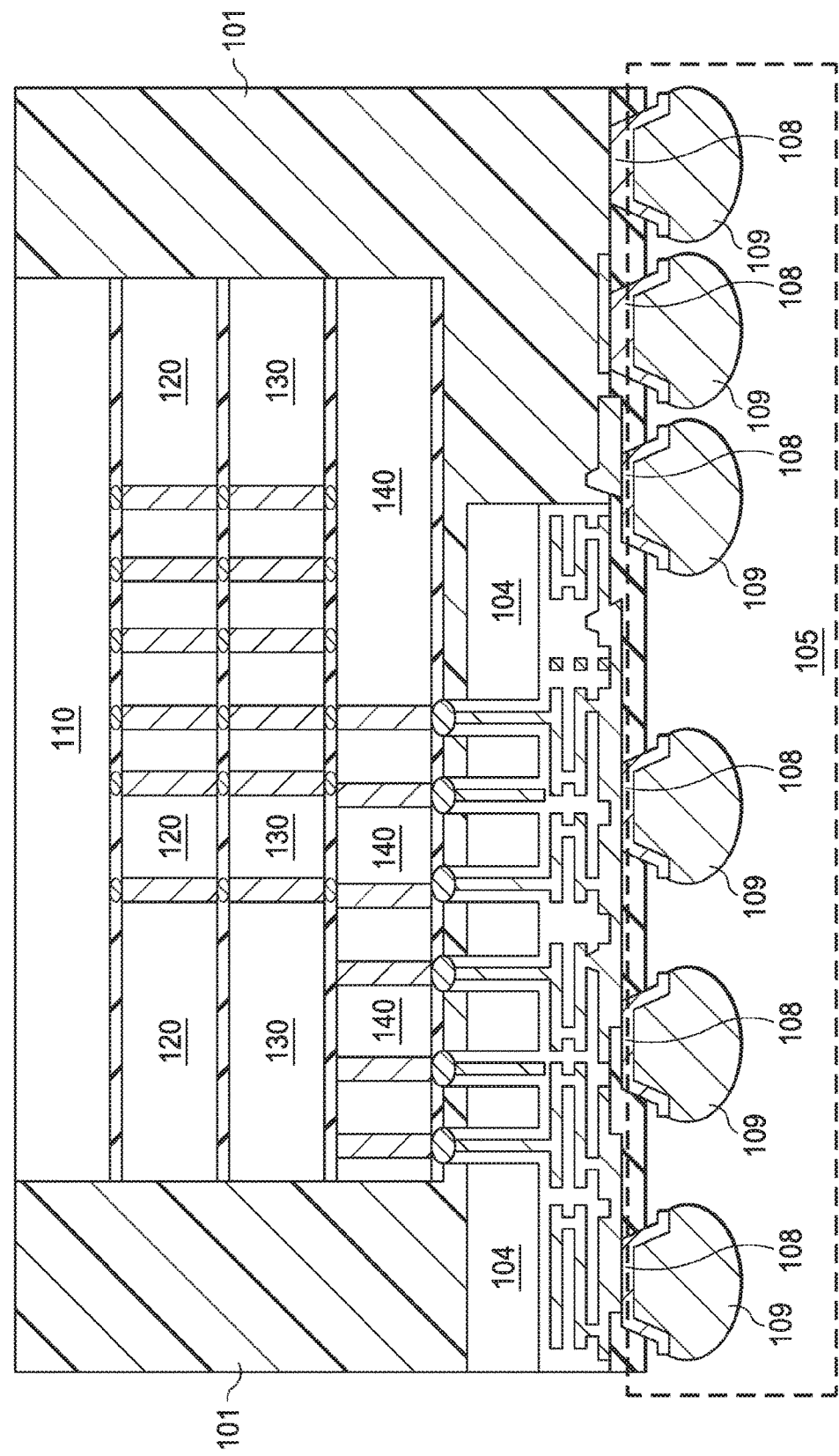

FIG. 16 illustrates a cross sectional view of another multi-chip semiconductor device with a fan-out structure in accordance with various embodiments of the present disclosure. The multi-chip semiconductor device 1600 is similar to the multi-chip semiconductor device 1300 shown in FIG. 13 except that the first chip 102 is not shifted to the edge of the fan-out structure 105. The fabrication process of the multi-chip semiconductor device 1300 is similar to that of multi-chip semiconductor device 100, and hence is not discussed herein to avoid repetition.

Figure 17:
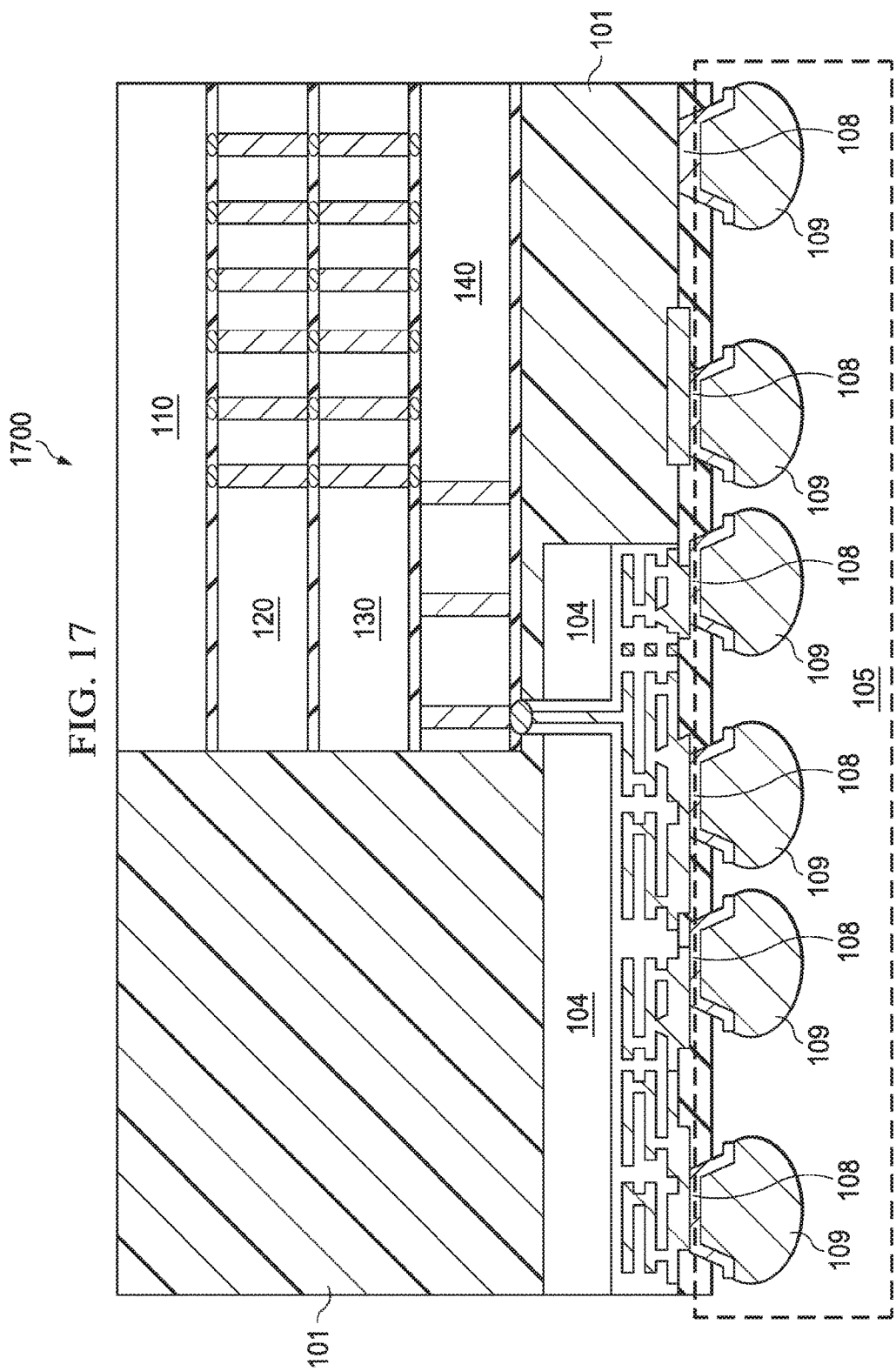

FIG. 17 illustrates a cross sectional view of another multi-chip semiconductor device with a fan-out structure in accordance with various embodiments of the present disclosure. The multi-chip semiconductor device 1700 is similar to the multi-chip semiconductor device 1300 shown in FIG. 13 except that there may be one through via connection between the first chip 102 and the second chip 104.

Figure 18:
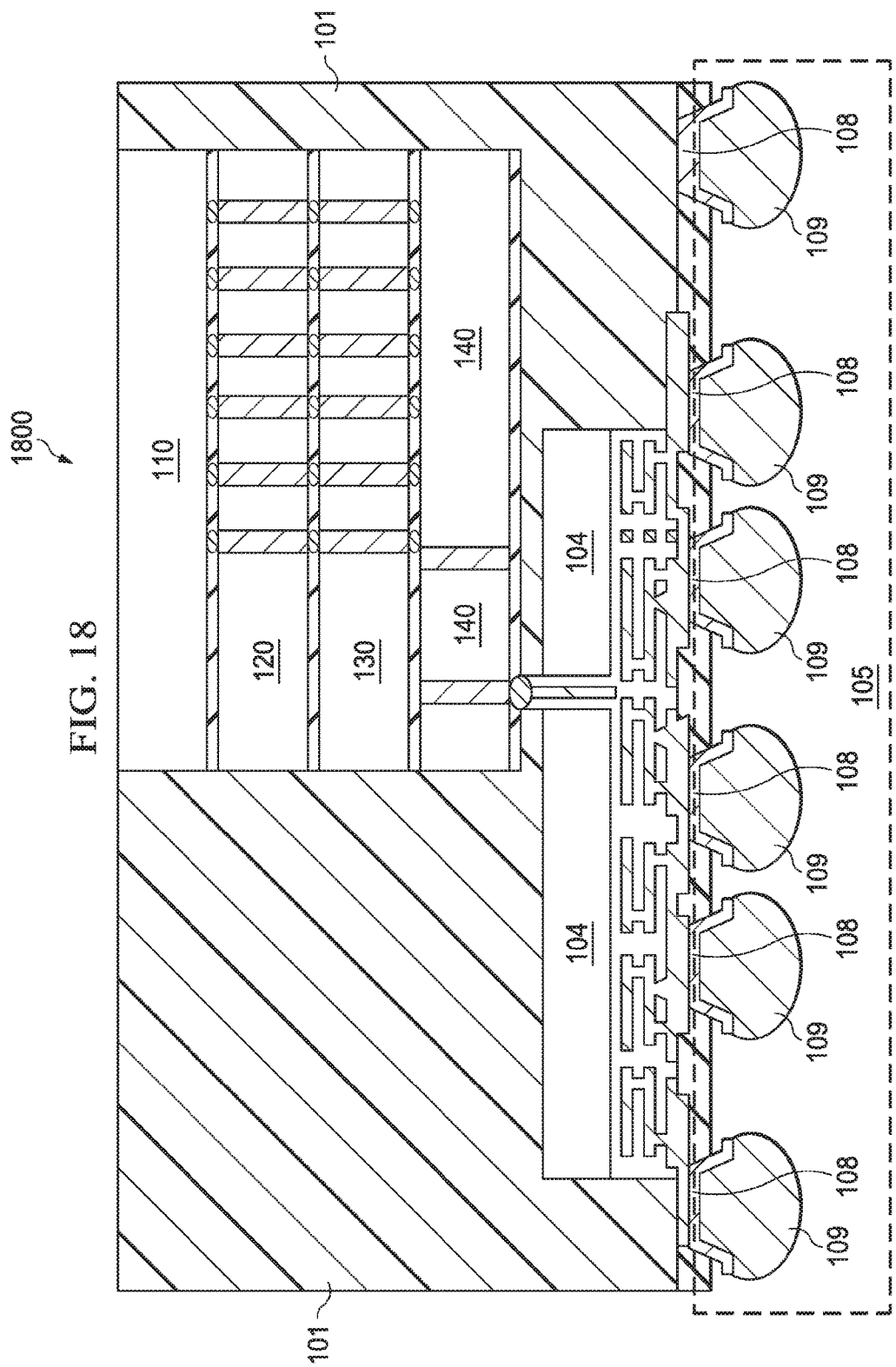
Figure 19:
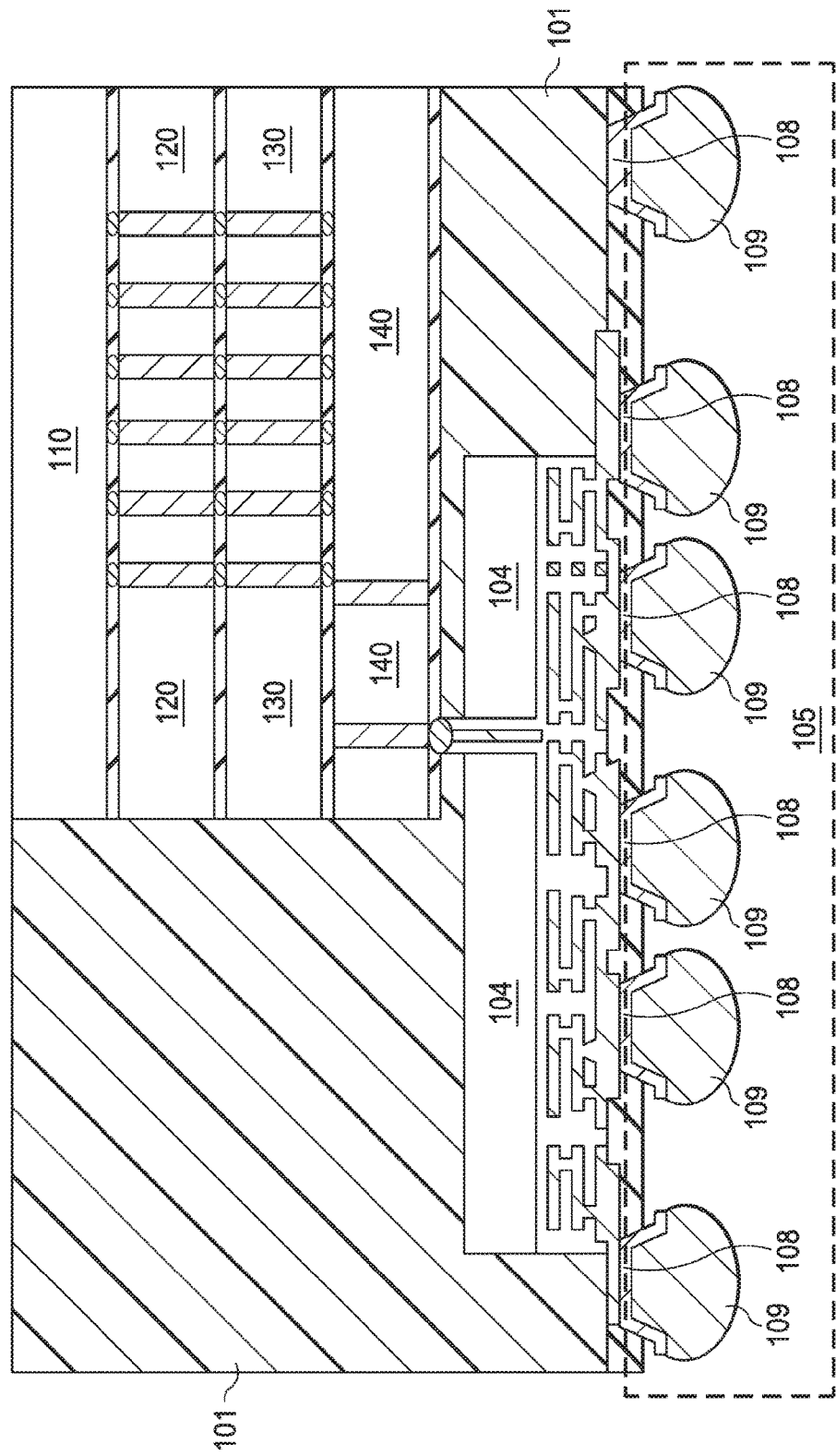

The shift between the first chip 102 and the second chip 104 may include a variety of variations. An overlap between the first chip 102 and the second chip 104 is required so that at least one through via of the first chip 102 is connected to a corresponding through via of the second chip 104 through a conductive bump. The fabrication process of the multi-chip semiconductor device 1700 is similar to that of multi-chip semiconductor device 100, and hence is not discussed herein to avoid repetition. The embodiments shown in FIGS. 18-20 are similar to the embodiments in FIGS. 14-16 respectively except that there may be one connection path between the first chip 102 and the second chip 104.

In accordance with an embodiment, a device comprises a fan-out structure comprising a redistribution layer over a molding compound layer, a first chip over the fan-out structure, wherein the first chip comprise a plurality of first through vias connected to the redistribution layer and a second chip over the first chip, the second chip being connected to the first chip through a plurality of bumps, wherein the first chip and the second chip are in the molding compound layer, and wherein a center line of the first chip is not vertically aligned with a center line of the second chip.

In accordance with an embodiment, a device comprises a first chip and a second chip stacked together to form a multi-chip structure, wherein the first chip and the second chip are in an encapsulation layer, and wherein there is a separation between a center line of the first chip and a center line of the second chip, a redistribution layer on a surface of a first side of the encapsulation layer and a plurality of conductive bumps over the redistribution layer.

In accordance with an embodiment, a method comprises mounting a second chip on a first chip, and wherein a center line of the first chip is not vertically aligned with a center line of the second chip, forming a molding compound layer over the first chip and the second chip, wherein the first chip and the second chip are embedded in the molding compound layer, grinding the molding compound layer until a surface of the second chip is exposed, forming a redistribution layer on the surface of the second chip and forming a plurality of bumps over the redistribution layer.

Although embodiments of the present disclosure and its advantages have been described in detail, it should be understood that various changes, substitutions and alterations can be made herein without departing from the spirit and scope of the disclosure as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A device comprising:
   a fan-out structure comprising a redistribution layer over a molding compound layer;
   a first chip over the fan-out structure, wherein the first chip comprise a plurality of first through vias connected to the redistribution layer; and
   a second chip over the first chip, the second chip being connected to the first chip through a plurality of bumps, wherein the first chip and the second chip are in the molding compound layer, and wherein a center line of the first chip is not vertically aligned with a center line of the second chip, wherein a sidewall of the first chip or a sidewall of the second chip is exposed outside the molding compound layer.

2. The device of claim 1, further comprising:
   a dielectric layer over the redistribution layer;
   an under bump metallization structure over the dielectric layer; and
   a solder ball over the under bump metallization structure.

3. The device of claim 1, wherein:
   the second chip comprises a plurality of memory dies stacked together; and
   the first chip comprises a plurality of logic circuits.

4. The device of claim 1, wherein:
   a first sidewall of the first chip is exposed outside the molding compound layer;
   a second sidewall of the first chip is covered by the molding compound layer;
   a first sidewall of the second chip is covered by the molding compound layer; and
   a second sidewall of the second chip is exposed outside the molding compound layer.

5. The device of claim 1, wherein:
   a first sidewall and a second sidewall of the first chip are covered by the molding compound layer;
   a first sidewall of the second chip is covered by the molding compound layer; and
   a second sidewall of the second chip is exposed outside the molding compound layer.

6. The device of claim 1, wherein:
   a first sidewall of the first chip is exposed outside the molding compound layer;
   a second sidewall of the first chip is covered by the molding compound layer; and
   a first sidewall and a second sidewall of the second chip are covered by the molding compound layer.

7. The device of claim 1, wherein:
   a first side of the second chip is connected to the first chip through the plurality of bumps.

8. The device of claim 1, wherein:
   the redistribution layer extends beyond a first sidewall and a second sidewall of the first chip.

9. The device of claim 7, wherein:
   a surface of a second side of the second chip is exposed outside the molding compound layer.

10. A device comprising:
    a first chip and a second chip stacked together to form a multi-chip structure, wherein the first chip and the second chip are in an encapsulation layer, and wherein there is a separation between a center line of the first chip and a center line of the second chip;
    a redistribution layer on a surface of a first side of the encapsulation layer, wherein the first chip is in direct contact with the redistribution layer, and a non-bonding surface of the second chip is exposed at a second side of the encapsulation layer; and a plurality of conductive bumps over the redistribution layer.

11. The device of claim 10, further comprising:

a dielectric layer over the redistribution layer; and a plurality of under bump metallization structures between the dielectric layer and the plurality of conductive bumps.

12. The device of claim 10, wherein:

at least one sidewall of the first chip is exposed outside the encapsulation layer; and at least one sidewall of the second chip is exposed outside the encapsulation layer.

13. The device of claim 10, wherein:

a width of the second chip is greater than a width of the first chip.

14. The device of claim 10, wherein:

a sidewall of the first chip is exposed outside the encapsulation layer; and two sidewalls of the second chip are covered by the encapsulation layer.

15. The device of claim 10, wherein:

two sidewalls of the first chip are covered by the encapsulation layer; and a sidewall of the second chip is exposed outside the encapsulation layer.

16. A method comprising:

mounting a second chip on a first chip, and wherein a center line of the first chip is not vertically aligned with a center line of the second chip;

forming a molding compound layer over the first chip and the second chip, wherein the first chip and the second chip are embedded in the molding compound layer;

grinding the molding compound layer until a surface of the second chip is exposed;

forming a redistribution layer on the surface of the second chip; and forming a plurality of bumps over the redistribution layer.

17. The method of claim 16, wherein:

the redistribution layer extends beyond at least one sidewall of the second chip.

18. The method of claim 16, further comprising:

applying a reflow process to the first chip and the second chip so that the second chip is bonded on the first chip through a plurality of conductive bumps formed between the first chip and the second chip.

19. The method of claim 16, wherein:

the first chip is a memory chip; and the second chip is a processor chip.

20. The method of claim 16, further comprising:

depositing a dielectric layer over the redistribution layer;

forming a plurality of under bump metallization structures in the dielectric layer; and forming the plurality of bumps over the plurality of under bump metallization structures.

* * * * *